(12) United States Patent
Lee et al.

(10) Patent No.: US 8,184,025 B2
(45) Date of Patent: May 22, 2012

(54) METHOD AND APPARATUS OF GENERATING CODEWORDS IN WIRELESS COMMUNICATION SYSTEM

(75) Inventors: Young Seob Lee, Anyang-si (KR); Bin Chul Ihm, Anyang-si (KR); Jin Young Chun, Anyang-si (KR); Suk Woo Lee, Anyang-si (KR); Min Seok Oh, Anyang-si (KR)

(73) Assignee: LG Electronics Inc., Seoul (KR)

( * ) Notice: Subject to any disclaimer, the term of this patent is extended or adjusted under 35 U.S.C. 154(b) by 42 days.

(21) Appl. No.: 12/990,626

(22) PCT Filed: May 8, 2009

(86) PCT No.: PCT/KR2009/002420
§ 371 (c)(1),
(2), (4) Date: Nov. 1, 2010

(87) PCT Pub. No.: WO2009/136751
PCT Pub. Date: Nov. 12, 2009

(65) Prior Publication Data
US 2011/0043391 A1    Feb. 24, 2011

Related U.S. Application Data

(60) Provisional application No. 61/109,160, filed on Oct. 28, 2008, provisional application No. 61/113,204, filed on Nov. 10, 2008, provisional application No. 61/140,889, filed on Dec. 26, 2008, provisional application No. 61/149,682, filed on Feb. 3, 2009.

(30) Foreign Application Priority Data

| May 8, 2008 | (KR) | 10-2008-0042752 |
| Sep. 4, 2008 | (KR) | 10-2008-0087382 |
| Oct. 21, 2008 | (KR) | 10-2008-0103306 |

(51) Int. Cl.
*H03M 7/40* (2006.01)
(52) U.S. Cl. ............... 341/67; 341/65; 341/106
(58) Field of Classification Search ............ 341/65, 341/67, 106
See application file for complete search history.

(56) References Cited

U.S. PATENT DOCUMENTS

| 5,696,506 A | 12/1997 | Yu |
| 6,990,626 B2 * | 1/2006 | Ashikhmin ............ 714/794 |
| 7,093,189 B2 * | 8/2006 | Lee et al. ............ 714/797 |
| 7,313,752 B2 | 12/2007 | Kyung et al. |
| 7,395,494 B2 * | 7/2008 | Lee et al. ............ 714/801 |
| 7,774,678 B2 * | 8/2010 | Choi et al. ............ 714/758 |

FOREIGN PATENT DOCUMENTS
WO    WO 2008/044841 A1    4/2008
* cited by examiner

*Primary Examiner* — Khai M Nguyen
(74) *Attorney, Agent, or Firm* — Birch, Stewart, Kolasch & Birch, LLP

(57) ABSTRACT

A method and apparatus for generating and transmitting codewords is provided. The method includes receiving information bits with a variable length, selecting vectors by the length of the information bits from a generator matrix, and generating a codeword based on the information bits and the generator matrix. Codewords with a certain length providing a coding performance with respect to received variable information bits can be obtained.

15 Claims, 9 Drawing Sheets

[Fig. 2]
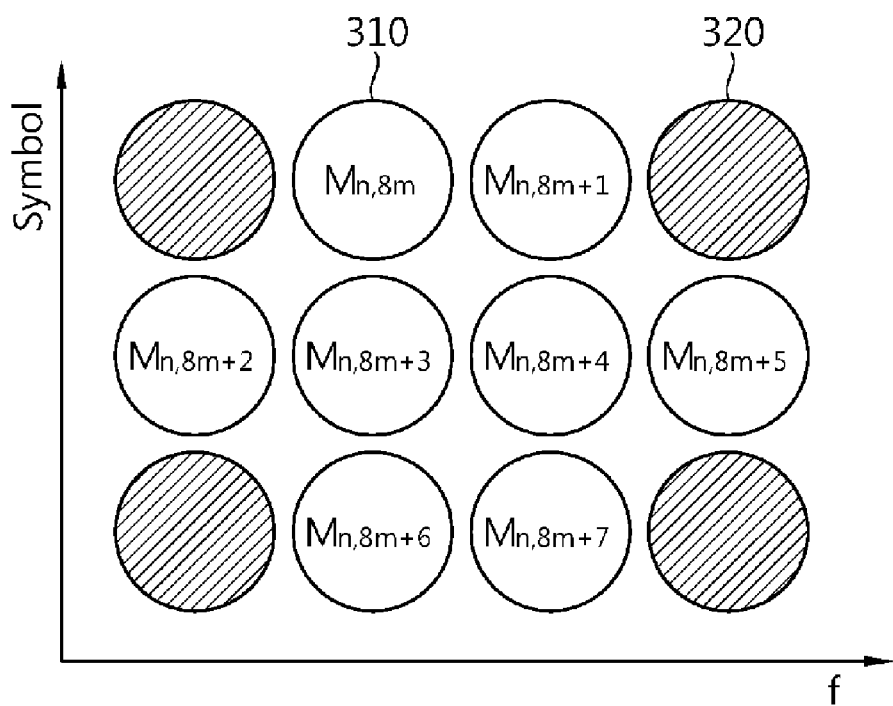

[Fig. 3]
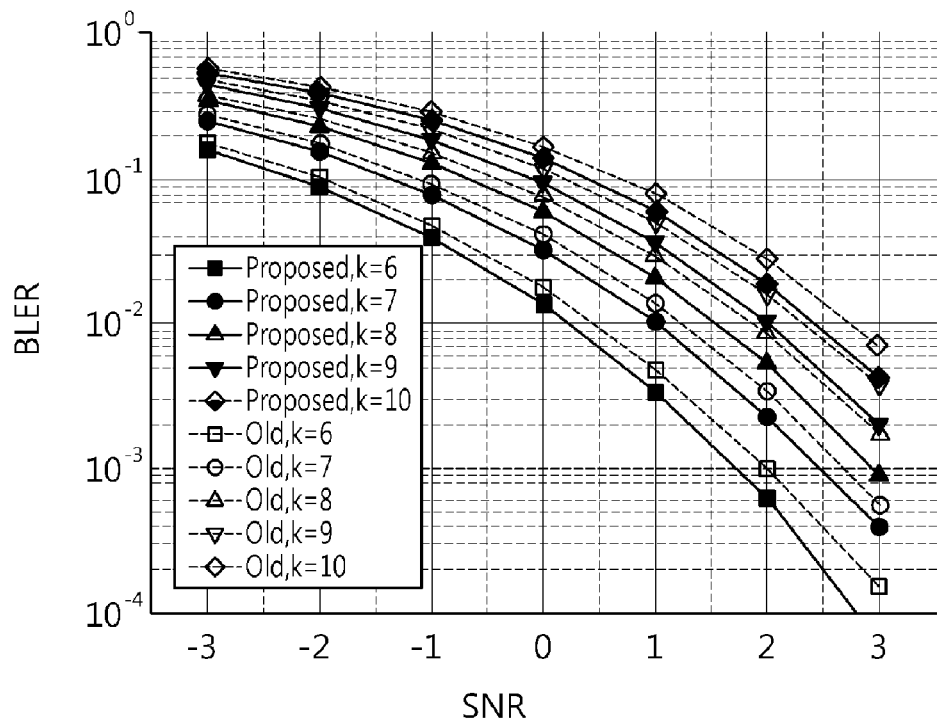
[Fig. 4]
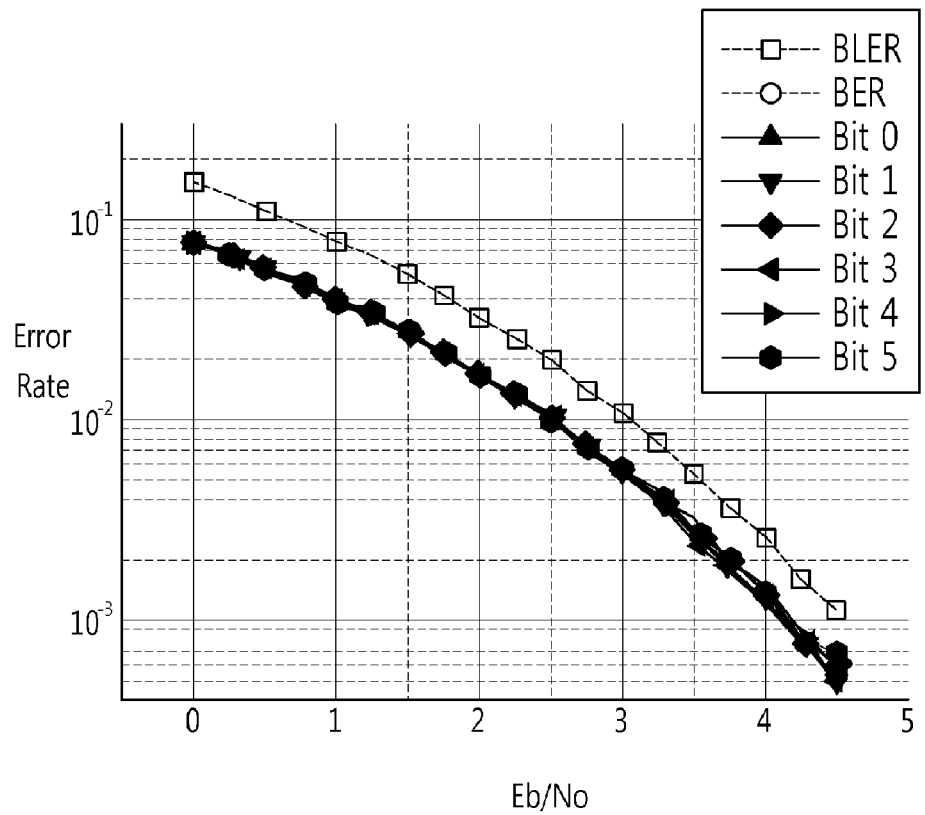

[Fig. 5]
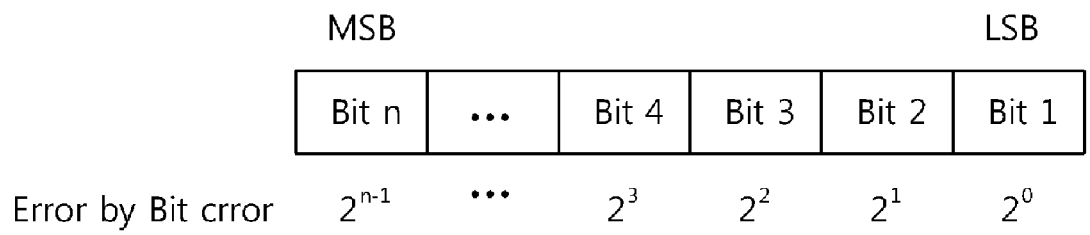
[Fig. 6]
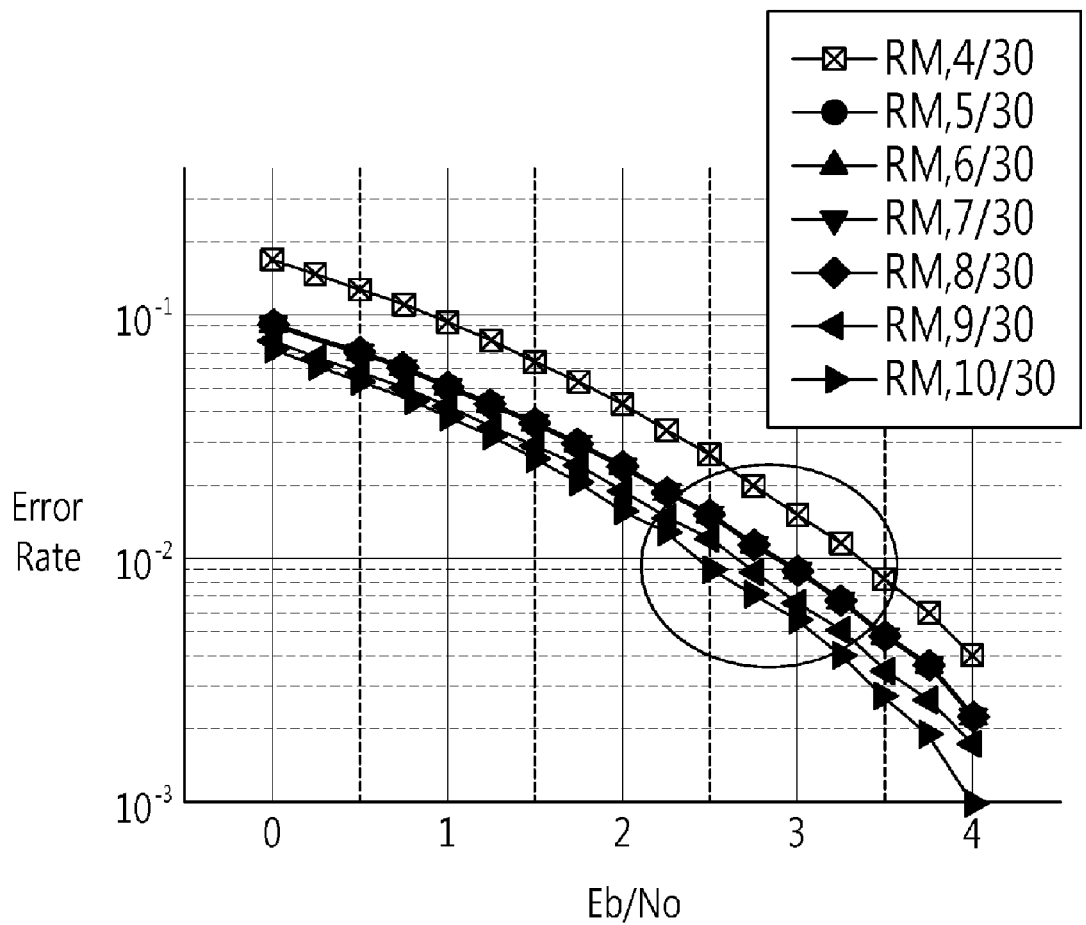

[Fig. 7]
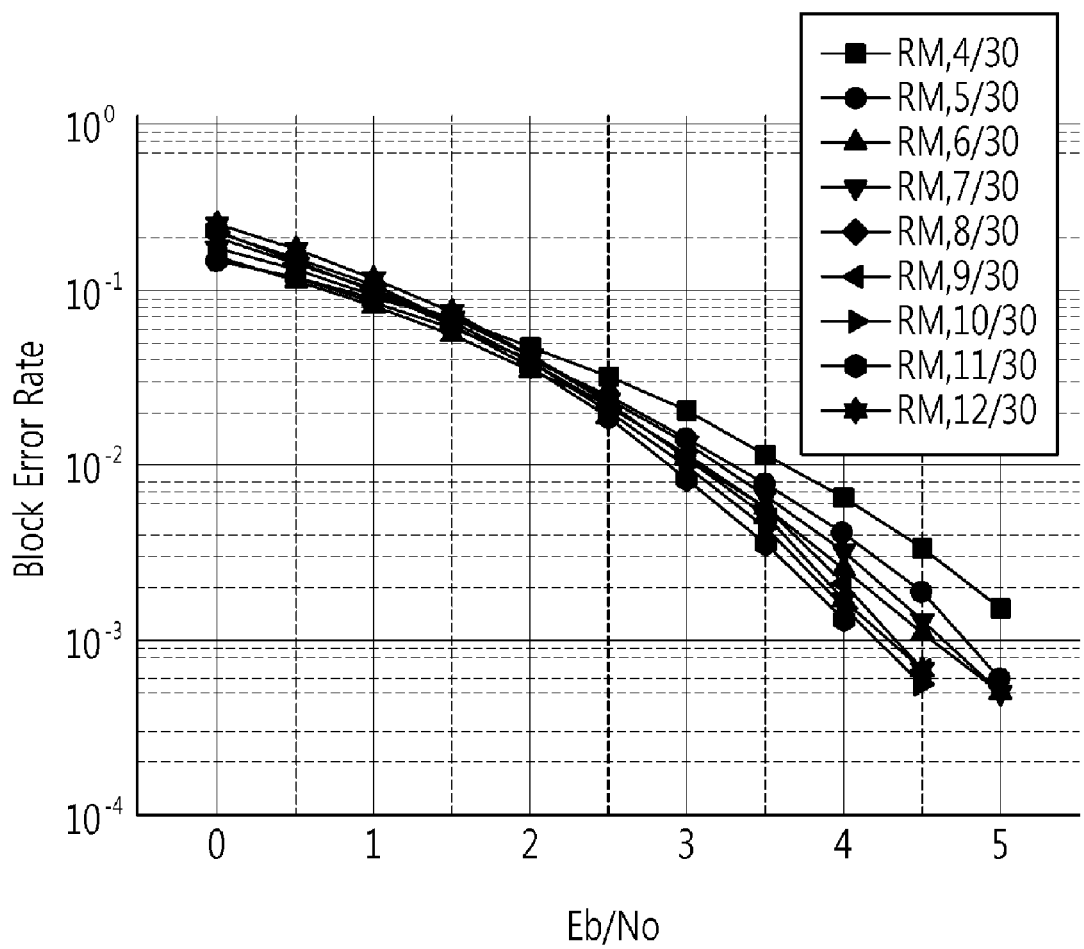

[Fig. 9]
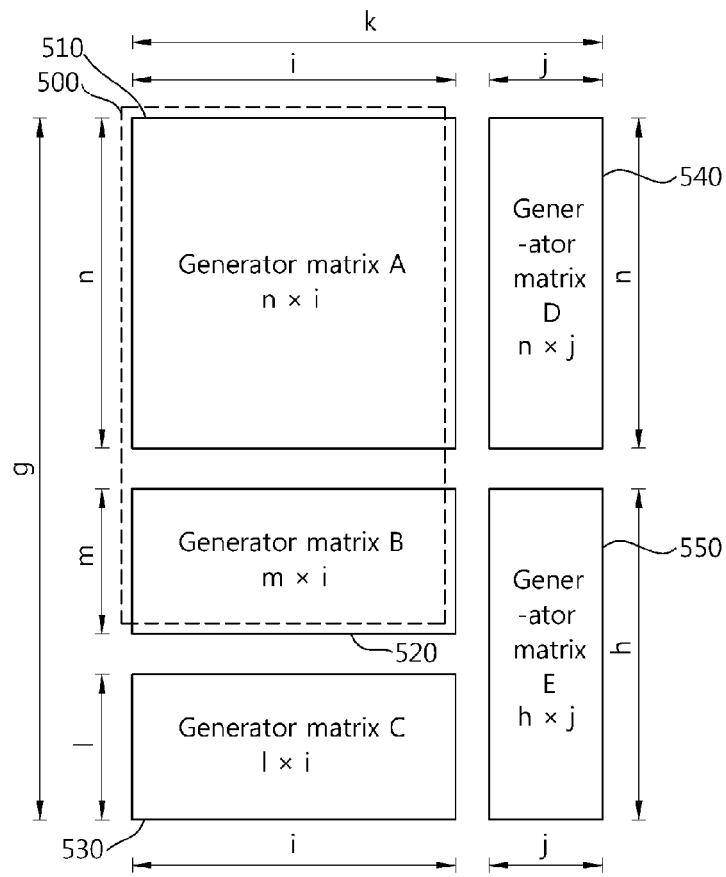
[Fig. 10]
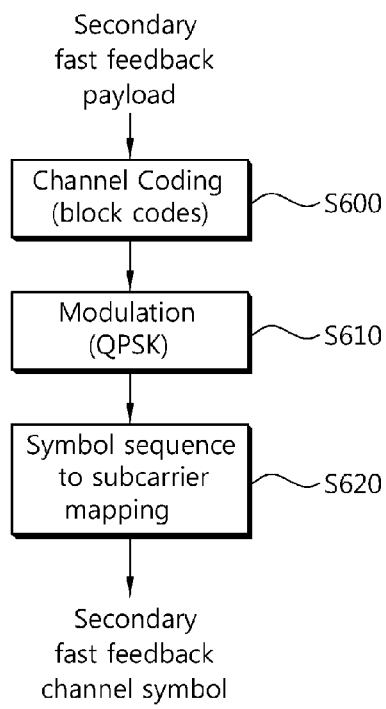

[Fig. 11]
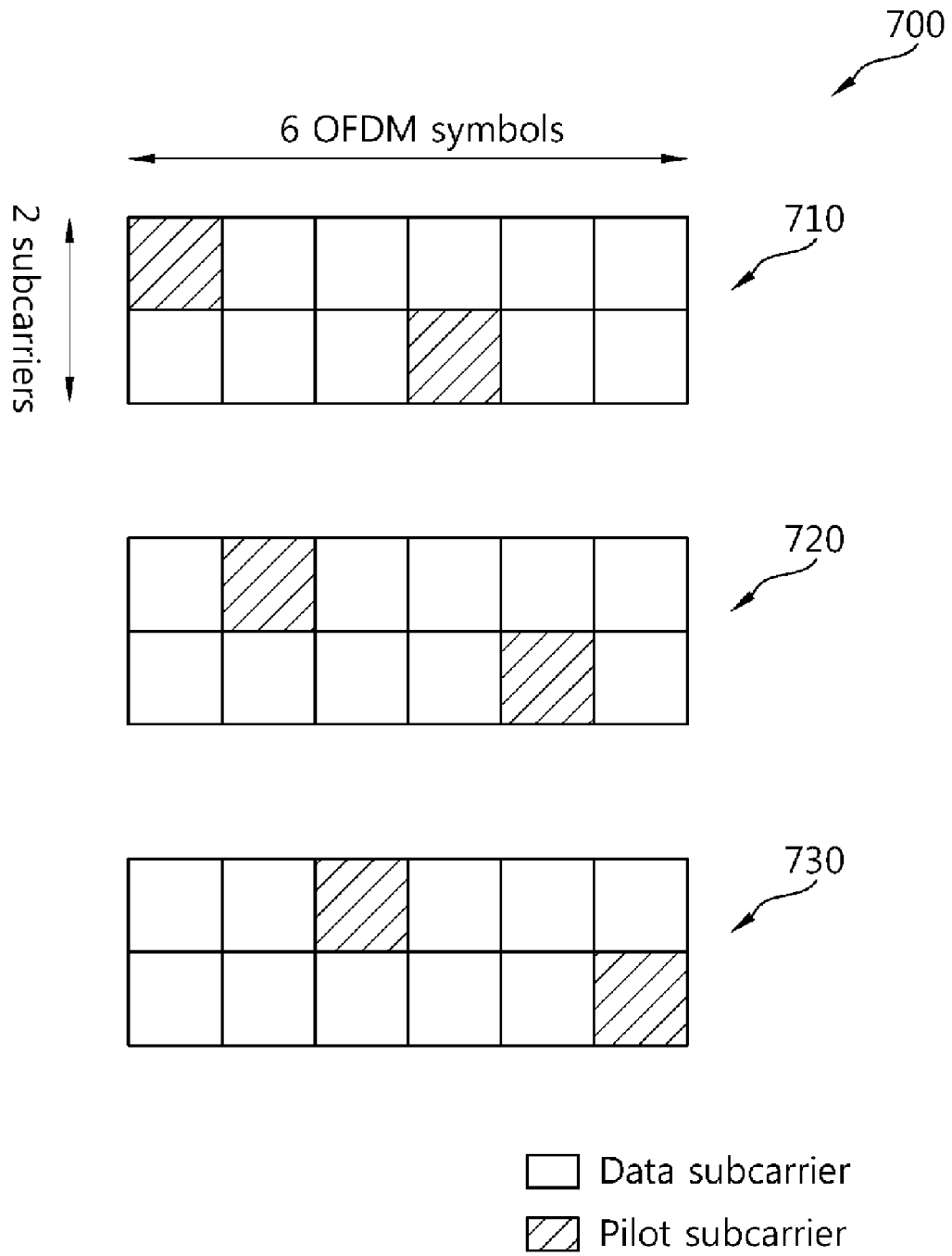

[Fig. 12]
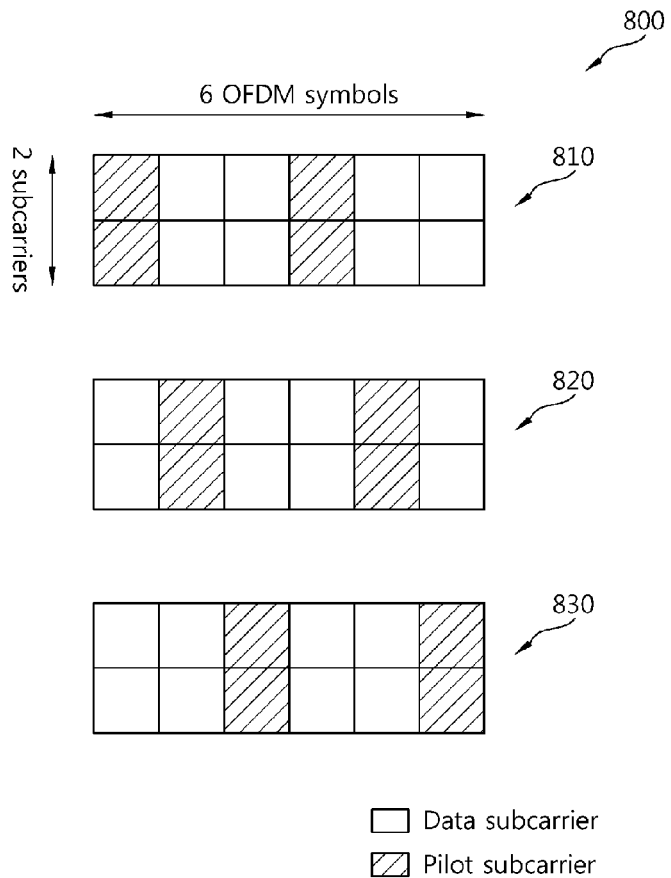
[Fig. 13]
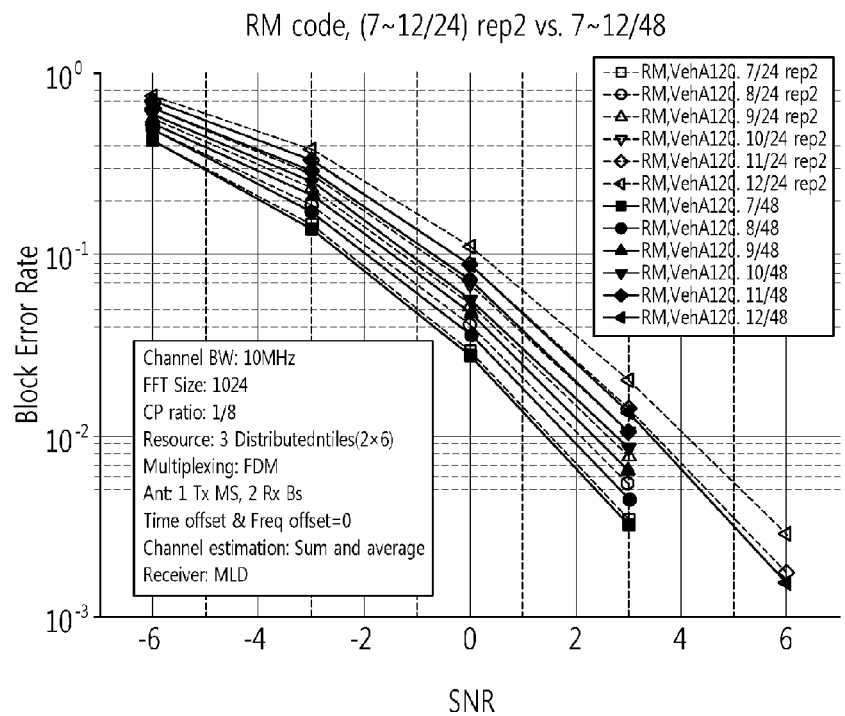

METHOD AND APPARATUS OF GENERATING CODEWORDS IN WIRELESS COMMUNICATION SYSTEM

This application is a National Phase of PCT/KR2009/002420 filed on May 8, 2009, which claims priority under 35 USC 119(e) to U.S. Provisional Application Nos. 61/109,160, 61/113,204, 61/140,889 and 61/149,682 filed Oct. 28, 2008, Nov. 10, 2008, Dec. 26, 2008 and Feb. 3, 2009 and under 35 USC 119(a) to Patent Application Nos. 10-2008-0042752, 10-2008-0087382, and 10-2008-0103306 filed in Republic of Korea, on May 8, 2008, Sep. 4, 2008 and Oct. 21, 2008, all of which are hereby expressly incorporated by reference into the present application.

TECHNICAL FIELD

The present invention relates wireless communication and, more particularly, to a method and apparatus for generating and transmitting codewords based on block coding in a wireless communication system.

BACKGROUND ART

Recently, as a next-generation multimedia wireless communication system on which research is actively ongoing, a high speed communication system that can process diverse information such as images, radio data, and the like, and transmit the same, beyond voice-centered services is required.

One of the basic issues to achieve high speed communications is how effectively and reliably data can be transmitted via channels. Unlike a wireline channel environment, a radio channel environment existing for a wireless communication system involves many factors such as multipath interference, shadowing, propagation attenuation, time-varying noise, interference, fading, and the like, which inevitably cause errors to make a loss of information.

Channel coding is a process for coding information bits to generate codewords to prevent a loss of information. Here, a codeword refers to a bit stream generated by performing a particular processing on information bits to improve detection performance in transmitting the information bits.

The channel coding includes a block type channel coding (referred to as 'block coding', hereinafter) and a Trellis type channel coding. The block coding includes a channel coding using a Bose-Chadhuri-Hocquenghem (BCH) code or a Reed-Muller (RM) code. In the block coding, a codeword may be generated by using a matrix block called a generating matrix. Unlike the Trellis type channel coding, the block coding does not have a memory between continuously generated blocks, so front and rear blocks have no relation. The Trellis type channel coding includes a channel coding using a convolutional code or a Turbo code. In the Trellis type channel coding, a codeword may be generated by using a polynomial expression such as a generating polynomial.

The process of generating codewords in a Reed-Muller coding-based communication system will now be described by using Equations 1 to 3 shown below. If a generator matrix G is assumed to have a size of 6×36, the generator matrix G may be represented by basic sequences (or vectors) $v_1, v_2, v_3, v_4, v_5, 1$ as shown in Equation 1.

MathFigure 1

$$\begin{bmatrix} v_1 = (010101010101010101010101010101010101) \\ v_2 = (001100110011001100110011001100110011) \\ v_3 = (000011110000111100001111000011110000111100001111) \\ v_4 = (000000001111111100000000111111110000000011111111) \\ v_5 = (000000000000000011111111111111111111) \end{bmatrix} = G_1$$

[Math. 1]

$$[1 = (111111111111111111111111111111111111)] = G_0$$

Input information bits 'm' with a length of 6 may be represented by Equation 2 shown below:

MathFigure 2

$$m = [m_1, m_2, m_3, m_4, m_5, m_0] = [M_1 | m_0]$$

[Math. 2]

Accordingly, a codeword 'b' a modulo computation result of the product of the information bits and the generator matrix G, may be represented by Equation 3 shown below:

MathFigure 3

$$b = \left([M_1 | m_0]\begin{bmatrix} G_1 \\ G_0 \end{bmatrix}\right) \bmod 2$$

[Math. 3]

$$= (m_1 v_1 + m_2 v_2 + m_3 v_3 + m_4 v_4 + m_5 v_5 + m_0 1) \bmod 2$$

A receiver receives a particular transmission sequence called the codeword generated thusly and decodes the sequence to determine what the received information bits are. Over a memoryless channel in which error probabilities from one symbol to a next symbol are mutually independent, the receiver compares the received sequence with every available codeword and selects a codeword closest to the received sequence in consideration of the reliability of the received symbol.

In this case, the difference between the size of the received sequence and that of the codeword or the distance between the sizes of codewords is called a distance. The shortest distance between codewords is a key factor for determining the characteristics of codes, which is called a minimum distance. For example, it is assumed that there are codewords of 000, 010, 110. The distance between 000 and 110 is 2, the distance between 000 and 010 is 1, and the distance between 010 and 110 is 1, so the minimum distance is 1.

When a minimum distance of a certain block code is $d_{min}$, codewords of the block code have different values at the at least $d_{min}$ number of positions. This means that although the $d_{min}-1$ or smaller number of errors are generated, the receiver will not take the codewords as any different codewords.

If the number of bits of the codewords increases, the minimum distance would increase, obtaining excellent detection performance. In this case, however, because too many number of bits are used, a transmission efficiency may be degraded. Conversely, if the number of bits of the codewords is reduced, the transmission efficiency would increase but the minimum distance may be shortened to degrade the detection performance, and in this case, because the detection performance is determined to be sensitive to an error difference according to channel compensation, the performance of a rapidly time-varying channel may be degraded. That is, in the block coding, the detection performance and the transmission efficiency are in a trade-off relationship.

If the number of bits of information desired to be transmitted is not large, generally, a block code that exhibits good error correction performance at a short information length is used to transmit the information. As for resources used for transmission, a fixed amount of resource is allocated in consideration of convenience of resource management in a system.

In general, if the amount of information to be transmitted is small, it is robustly transmitted through simple repetition via a block code supporting an information length and a codeword length of small sizes, and if information is to be transmitted more robustly or the amount of information to be transmitted is large, the information is divided into several codewords and transmitted, thereby utilizing available resources to its maximum level. However, the corresponding block code has a relatively low error correction capability, makes it difficult to effectively design a generating matrix, and takes much time for its generation.

Thus, a method for improving a detection performance and generating a block coding-based codeword with a good error correction capability is required.

DISCLOSURE OF INVENTION

Technical Problem

The present invention provides a method and apparatus for generating block coding-based codewords upon receiving variable information bits.

Technical Solution

To achieve the above object, in one aspect, there is provided a method for generating a codeword, including: receiving information bits $m_k$ ($1 \leq k \leq r$) with a variable length; selecting vectors by the length of $m_k$ from an it ($i=1$ and i is integer) generator matrix $G=[v_1, v_2, \ldots, v_r]$ including r number of vectors; performing operation of $$b = \sum_{n=1}^{k} (m_n \times v_n) \mod 2$$

on the information bits to generate a codeword b with a length i. Here, mod is a modulo operation.

ADVANTAGEOUS EFFECTS

Codewords of a certain length providing optimized coding performance with respect to an input of variable information bits can be obtained.

BRIEF DESCRIPTION OF DRAWINGS

The present invention will become more fully understood from the detailed description given hereinbelow and the accompanying drawings, which are given by illustration only, and thus are not limitative of the present invention, and wherein:

FIG. 2 illustrates a tile structure in a partial usage of sub-channels (PUSC).

FIG. 3 is a simulation graph showing performance when a method for transmitting a codeword according to an exemplary embodiment of the present invention is used.

FIG. 4 is a simulation graph showing one example of bit error rates (BERs) of information bits.

FIG. 5 illustrates error values when each information bit has an error.

FIG. 6 is a simulation graph showing another example of a bit error rate of each information bit.

FIG. 7 is a simulation graph showing block error rate (BER) in case of channel coding by using masking codes.

FIG. 9 illustrates a generator matrix designed according to a proposed method.

FIG. 10 illustrates a process of mapping information in an SFBCH.

FIG. 11 shows one example of the SFBCH.

FIG. 12 shows another example of the SFBCH.

FIG. 13 shows a comparison between performances of a case where a generator matrix is designed through a simple repetition and a case that a generator matrix is designed according to a proposed method.

MODE FOR THE INVENTION

The technique described hereinafter may be used for diverse wireless communication systems. The wireless communication system is widely used to provide a variety of communication services such as communication of voice, packet data, etc. This technique may be used for downlink or uplink. In general, downlink refers to communication from a base station (BS) to a user equipment (UE), and uplink refers to communication from the UE to the BS. The BS generally refers to a fixed station that communicates with the UE and may be called by other names such as node-B, base transceiver system (BTS), access point (AP), etc. The UE may be fixed or mobile, and may be referred to by other names such as mobile station (MS), user terminal (UT), subscriber station (SS), wireless device, etc. In the downlink, a transmitter may be a part of the BS, and a receiver may be a part of the UE. In the uplink, a transmitter may be a part of the UE, and a receiver may be a part of the BS.

Figure 1:
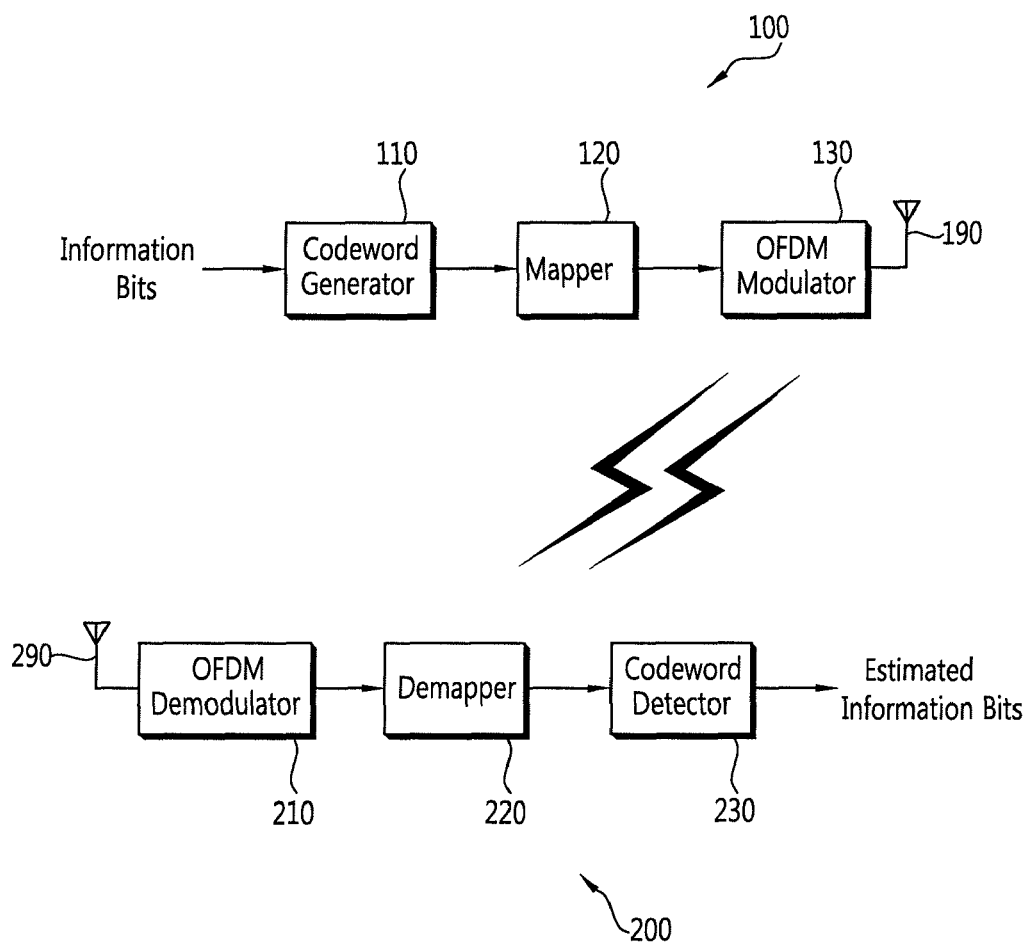
FIG. 1 is a schematic block diagram of a transmitter and a receiver according to an exemplary embodiment of the present invention.

FIG. 1 is a schematic block diagram of a transmitter and a receiver according to an exemplary embodiment of the present invention.

With reference to FIG. 1, a transmitter 100 includes a codeword generator 110, a mapper 120, and an orthogonal frequency division multiplexing (OFDM) modulator 130.

The codeword generator 110 processes input information bits to generate a codeword. The method for generating the codeword will be described later.

The mapper 120 modulates the codeword according to a predetermined modulation scheme and maps the modulated codeword to symbols expressing positions according to amplitude and phase constellation. The OFDM modulator 130 converts inputted symbols into OFDM symbols. The OFDM modulator 130 may perform inverse fast Fourier transform (IFFT) on the input symbols to convert them into time domain samples. A cyclic prefix (CP) may be added to the converted time domain samples. The OFDM symbols outputted from the OFDM modulator 130 are transmitted via a transmission antenna 190.

A receiver 200 includes an OFDM demodulator 210, a demapper 220, and a codeword detector 230.

A signal received via a reception antenna 290 is converted into frequency domain symbols by the OFDM demodulator 210. The OFDM demodulator 210 may remove the CP of the input signal and perform FFT on the signal. The demapper 220 demaps the input symbols. The codeword detector 230 detects estimated information bits through auto-correlation and cross-correlation of the codeword.

The transmitter 100 and the receiver 200 perform their operations according to a single-input single-output (SISO) scheme using the single transmission antenna and the single reception antenna, but the technical idea of the present invention can be also applicable as it is to a multiple-input multiple-output (MIMO) system including a plurality of transmission antennas and a plurality of reception antennas.

The transmitter 100 and the receiver 200 are OFDM/OFDMA-based systems, but the technical idea of the present invention can be also applicable as it is to any other wireless access scheme-based systems such as a time division multiple access (TDMA), a code division multiple access (CDMA), and the like.

The method of generating codewords by the codeword generator 110 will now be described.

The codeword generator 110 generates a codeword according to Equation 4 shown below:

MathFigure 4

$$b = \sum_{n=1}^{k} (m_n \times v_n) \mod 2 \qquad [\text{Math. 4}]$$

wherein $b=[b_1, b_2, \ldots, b_i]$ is a codeword with a length i (i=1, and i is integer), $m=[m_1, m_2, \ldots, m_k]$ is information bits with a variable length k (k=1, and k is integer), $v_k$ is basis sequences included in a generator matrix G based on block coding and is vectors with a length i. $m_1$ may be the most significant bit (MSB), and $m_k$ may be the least significant bit (LSB). Conversely, $m_1$ may be the LSB and $m_k$ may be the MSB.

The length of the information bits is variable, so the codeword generator 110 selects the number of sequences $v_k$ by (i.e., as long as) the length of the information bits. Namely, if k increases, the size of the generator matrix G accordingly expands, and if k decreases, the size of the generator matrix G is accordingly reduced. The codeword may be changed by being XORed with a particular sequence, which is possible by increasing the length of the information bits inputted by the number of cases that the codeword is changed. In this case, the codling performance and a substantial coding rate may vary according to the particular sequence. The particular sequence used for expanding the generator matrix based on Reed-Muller (RM) codes is also called masking codes.

Table 1 below shows an example of a generator matrix G which varies according to a change in the length of the information bit.

TABLE 1

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 0 | 0 | 0 | 0 | 0 | 0 | 1 | 0 | 0 | 0 | 0 |
| 1 | 1 | 0 | 0 | 0 | 0 | 1 | 0 | 0 | 0 | 0 |
| 2 | 0 | 1 | 0 | 0 | 0 | 1 | 1 | 0 | 0 | 0 |
| 3 | 1 | 1 | 0 | 0 | 0 | 1 | 0 | 0 | 0 | 1 |
| 4 | 0 | 0 | 1 | 0 | 0 | 1 | 1 | 0 | 1 | 1 |
| 5 | 1 | 0 | 1 | 0 | 0 | 1 | 0 | 0 | 0 | 1 |
| 6 | 0 | 1 | 1 | 0 | 0 | 1 | 0 | 0 | 1 | 0 |
| 7 | 1 | 1 | 1 | 0 | 0 | 1 | 0 | 1 | 0 | 0 |
| 8 | 0 | 0 | 0 | 1 | 0 | 1 | 0 | 1 | 1 | 0 |
| 9 | 1 | 0 | 0 | 1 | 0 | 1 | 1 | 1 | 1 | 0 |
| 10 | 0 | 1 | 0 | 1 | 0 | 1 | 1 | 0 | 1 | 1 |
| 11 | 1 | 1 | 0 | 1 | 0 | 1 | 0 | 0 | 1 | 1 |
| 12 | 0 | 0 | 1 | 1 | 0 | 1 | 0 | 1 | 1 | 0 |
| 13 | 1 | 0 | 1 | 1 | 0 | 1 | 0 | 1 | 0 | 1 |
| 14 | 0 | 1 | 1 | 1 | 0 | 1 | 1 | 0 | 0 | 1 |
| 15 | 1 | 1 | 1 | 1 | 0 | 1 | 1 | 1 | 1 | 1 |
| 16 | 0 | 0 | 0 | 0 | 1 | 1 | 1 | 0 | 0 | 0 |
| 17 | 1 | 0 | 0 | 0 | 1 | 1 | 1 | 0 | 0 | 0 |
| 18 | 0 | 1 | 0 | 0 | 1 | 1 | 1 | 1 | 0 | 1 |
| 19 | 1 | 1 | 0 | 0 | 1 | 1 | 1 | 0 | 1 | 0 |
| 20 | 0 | 0 | 1 | 0 | 1 | 1 | 0 | 1 | 1 | 1 |
| 21 | 1 | 0 | 1 | 0 | 1 | 1 | 0 | 1 | 0 | 1 |
| 22 | 0 | 1 | 1 | 0 | 1 | 1 | 0 | 0 | 1 | 1 |
| 23 | 1 | 1 | 1 | 0 | 1 | 1 | 0 | 1 | 1 | 1 |
| 24 | 0 | 0 | 0 | 1 | 1 | 1 | 0 | 1 | 0 | 0 |
| 25 | 1 | 0 | 0 | 1 | 1 | 1 | 1 | 1 | 0 | 1 |
| 26 | 0 | 1 | 0 | 1 | 1 | 1 | 1 | 0 | 1 | 0 |
| 27 | 1 | 1 | 0 | 1 | 1 | 1 | 1 | 0 | 0 | 1 |
| 28 | 0 | 0 | 1 | 1 | 1 | 1 | 0 | 0 | 1 | 0 |
| 29 | 1 | 0 | 1 | 1 | 1 | 1 | 1 | 1 | 0 | 0 |
| 30 | 0 | 1 | 1 | 1 | 1 | 1 | 1 | 1 | 1 | 0 |
| 31 | 1 | 1 | 1 | 1 | 1 | 1 | 1 | 1 | 1 | 1 |

With reference to Table 1, the generator matrix G has a size of 32×10. $v_1, v_2, \ldots, v_{10}$ are basis sequences (or vectors) included in the generator matrix G. The number ($v_k$) of columns is indexes of input information bits, and the number (i) of rows is bit indexes of the codeword generated by the generator matrix G. When information bits with a length of 7 is input, the generator matrix G may have a size of 32×7. In this case, the generator matrix G includes only the first to seventh columns, excluding the last three columns (i.e., the eighth to tenth columns). The size of the generator matrix G is expanded or reduced according to the length of the information bit, and this may be performed by the masking codes.

Table 2 below shows another example of the generator matrix G which varies according to a change in the length of the information bits.

TABLE 2

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 0 | 1 | 0 | 0 | 0 | 0 | 0 | 1 | 0 | 0 | 0 |
| 1 | 0 | 1 | 0 | 0 | 0 | 0 | 1 | 1 | 0 | 0 |
| 2 | 1 | 1 | 0 | 0 | 0 | 0 | 1 | 0 | 0 | 1 |
| 3 | 0 | 0 | 1 | 0 | 0 | 0 | 1 | 1 | 0 | 1 |
| 4 | 1 | 0 | 1 | 0 | 0 | 0 | 1 | 0 | 0 | 1 |
| 5 | 0 | 1 | 1 | 0 | 0 | 0 | 1 | 0 | 1 | 0 |
| 6 | 1 | 1 | 1 | 0 | 0 | 0 | 1 | 0 | 0 | 0 |
| 7 | 0 | 0 | 0 | 1 | 0 | 1 | 0 | 1 | 1 | 0 |
| 8 | 1 | 0 | 0 | 1 | 0 | 0 | 1 | 1 | 1 | 0 |
| 9 | 0 | 1 | 0 | 1 | 0 | 1 | 1 | 0 | 1 | 1 |
| 10 | 1 | 1 | 0 | 1 | 0 | 1 | 0 | 0 | 1 | 1 |
| 11 | 0 | 0 | 1 | 1 | 0 | 1 | 0 | 1 | 1 | 0 |
| 12 | 1 | 0 | 1 | 1 | 0 | 1 | 0 | 1 | 0 | 1 |
| 13 | 0 | 1 | 1 | 1 | 0 | 1 | 1 | 0 | 0 | 1 |
| 14 | 1 | 1 | 1 | 1 | 0 | 1 | 1 | 1 | 1 | 1 |
| 15 | 1 | 0 | 0 | 0 | 1 | 1 | 1 | 1 | 0 | 0 |
| 16 | 0 | 1 | 0 | 0 | 1 | 1 | 1 | 1 | 0 | 1 |
| 17 | 1 | 1 | 0 | 0 | 1 | 1 | 1 | 0 | 1 | 0 |
| 18 | 0 | 0 | 1 | 0 | 1 | 1 | 0 | 1 | 1 | 1 |
| 19 | 1 | 0 | 1 | 0 | 1 | 0 | 1 | 0 | 1 | 1 |
| 20 | 0 | 1 | 1 | 0 | 1 | 1 | 0 | 0 | 1 | 1 |
| 21 | 1 | 1 | 1 | 0 | 1 | 1 | 0 | 1 | 1 | 1 |
| 22 | 0 | 0 | 0 | 1 | 1 | 1 | 0 | 1 | 0 | 0 |
| 23 | 1 | 0 | 0 | 1 | 1 | 1 | 1 | 1 | 0 | 1 |
| 24 | 0 | 1 | 0 | 1 | 1 | 1 | 1 | 0 | 1 | 0 |
| 25 | 1 | 1 | 0 | 1 | 1 | 1 | 1 | 0 | 0 | 1 |
| 26 | 0 | 0 | 1 | 1 | 1 | 1 | 0 | 0 | 1 | 0 |

TABLE 2-continued

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 27 | 1 | 0 | 1 | 1 | 1 | 1 | 1 | 1 | 0 | 0 |
| 28 | 0 | 1 | 1 | 1 | 1 | 1 | 1 | 1 | 1 | 0 |
| 29 | 1 | 1 | 1 | 1 | 1 | 1 | 1 | 1 | 1 | 1 |
| 30 | 0 | 0 | 0 | 0 | 0 | 1 | 0 | 0 | 0 | 0 |
| 31 | 0 | 0 | 0 | 0 | 1 | 1 | 1 | 0 | 0 | 0 |

With reference to Table 2, the generator matrix G shows such a form that positions of some rows of Table 1 have been altered. Namely, in the generator matrix of Table 2, the $0^{th}$ row has been moved behind the $31^{st}$ row and the $15^{th}$ row has been moved to the position of the last row. Table 2 merely illustrates a permutation derived from the generator matrix of Table 1, and various generator matrixes may be derived from Table 1 according to any other permutation methods.

The method of generating the codeword having the variable information bits and the length of 32 has been described. A method of generating codewords with a length shorter than 32 bits will now be described.

The codeword generator 110 generates a codeword by using only some rows in the generator matrix G including 32 rows. The use of only some rows of the generator matrix G to generate a codeword without using the other remaining rows is called puncturing. Namely, puncturing may be a process of selecting only some rows from the generator matrix G and removing the other remaining rows. Hereinafter, the some rows selected from the generator matrix G through puncturing is called row sets. Meanwhile, a new generator matrix derived from the generator matrix G according to row sets is referred to as a generator matrix g. Hereinafter, it is assumed that the generator matrix used as a reference (basis) of puncturing is the generator matrix of Table 1.

Table 3 shows row sets used to generate a codeword in the generator matrix G of Table 1.

TABLE 3

| | row number | | | | | | | | | | | |
|---|---|---|---|---|---|---|---|---|---|---|---|---|
| Row Set 1 | 0 | 1 | 2 | 3 | 4 | 5 | 7 | 8 | 13 | 16 | 17 | 18 |
| | 19 | 20 | 21 | 22 | 24 | 25 | 26 | 27 | 28 | 29 | 30 | 31 |
| Row Set 2 | 0 | 1 | 4 | 5 | 7 | 8 | 10 | 11 | 12 | 13 | 14 | 15 |
| | 17 | 18 | 19 | 20 | 21 | 22 | 23 | 25 | 26 | 28 | 30 | 31 |
| Row Set 3 | 0 | 1 | 2 | 3 | 4 | 5 | 6 | 8 | 9 | 14 | 16 | 18 |
| | 19 | 20 | 21 | 22 | 23 | 24 | 26 | 27 | 28 | 29 | 30 | 31 |
| Row Set 4 | 0 | 1 | 2 | 5 | 6 | 8 | 9 | 11 | 12 | 13 | 14 | 15 |
| | 16 | 17 | 19 | 20 | 21 | 22 | 23 | 24 | 25 | 27 | 28 | 30 |

With reference to Table 3, the row numbers used to generate the codeword differ depending on respective row sets. A row number not included in the row sets is not used to generate the codeword (i.e., it is punctured). A generator matrix $g_1$ according to a row set 1 includes the 0, 1, 2, 3, 4, 5, 7, 8, 13, 16, 17, 18, 19, 20, 21, 22, 24, 25, 26, 27, 28, 29, 30, $31^{st}$ rows of the generator matrix G. Codewords generated by the generator matrix $g_1$ are

[$b_0$, $b_1$, $b_2$, $b_3$, $b_4$, $b_5$, $b_7$, $b_8$, $b_{13}$, $b_{16}$, $b_{17}$, $b_{18}$, $b_{19}$, $b_{20}$, $b_{21}$, $b_{22}$, $b_{24}$, $b_{25}$, $b_{26}$, $b_{27}$, $b_{28}$, $b_{29}$, $b_{30}$, $b_{31}$].

Likewise, a generator matrix $g_2$ according to a row set 2 includes the 0, 1, 4, 5, 7, 8, 10, 11, 12, 13, 14, 15, 17, 18, 19, 20, 21, 22, 23, 25, 26, 28, 30, $31^{st}$ rows of the generator matrix G. Codewords generated by the generator matrix $g_2$ are

[$b_0$, $b_1$, $b_4$, $b_5$, $b_7$, $b_8$, $b_{10}$, $b_{11}$, $b_{12}$, $b_{13}$, $b_{14}$, $b_{15}$, $b_{17}$, $b_{18}$, $b_{19}$, $b_{20}$, $b_{21}$, $b_{22}$, $b_{23}$, $b_{25}$, $b_{26}$, $b_{28}$, $b_{30}$, $b_{31}$].

A generator matrix $g_3$ according to a row set 3 includes the 0, 1, 2, 3, 4, 5, 6, 8, 9, 14, 16, 18, 19, 20, 21, 22, 23, 24, 26, 27, 28, 29, 30, $31^{st}$ rows of the generator matrix G. Codewords generated by the generator matrix $g_3$ are

[$b_0$, $b_1$, $b_2$, $b_3$, $b_4$, $b_5$, $b_6$, $b_8$, $b_9$, $b_{14}$, $b_{16}$, $b_{18}$, $b_{19}$, $b_{20}$, $b_{21}$, $b_{22}$, $b_{23}$, $b_{24}$, $b_{26}$, $b_{27}$, $b_{28}$, $b_{29}$, $b_{30}$, $b_{31}$].

A generator matrix $g_4$ according to a row set 4 includes the 0, 1, 2, 5, 6, 8, 9, 11, 12, 13, 14, 15, 16, 17, 19, 20, 21, 22, 23, 24, 25, 27, 28, $30^{th}$ rows of the generator matrix G. Codewords generated by the generator matrix $g_4$ are

[$b_0$, $b_1$, $b_2$, $b_5$, $b_6$, $b_8$, $b_9$, $b_{11}$, $b_{12}$, $b_{13}$, $b_{14}$, $b_{15}$, $b_{16}$, $b_{17}$, $b_{19}$, $b_{20}$, $b_{21}$, $b_{22}$, $b_{23}$, $b_{24}$, $b_{25}$, $b_{27}$, $b_{28}$, $b_{30}$].

Table 3 shows the combinations of rows (row sets) determined based on the generator matrix of Table 1. Thus, if it follows the generator matrix of Table 2, the row sets of Table 3 may be changed according to the way the generator matrix of Table 2 is rearranged from Table 1.

Table 4 shows the generator matrix $g_1$. The generator matrix $g_1$ has the size of 24×10 and basically includes the six basic sequences $v_1$ to $v_6$. The basis sequences $v_7$ to $v_{10}$ may be included or not in the generator matrix $g_1$ depending on the lengths of the information bits.

TABLE 4

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 0 | 0 | 0 | 0 | 0 | 0 | 1 | 0 | 0 | 0 | 0 |
| 1 | 1 | 0 | 0 | 0 | 0 | 1 | 0 | 0 | 0 | 0 |
| 2 | 0 | 1 | 0 | 0 | 0 | 1 | 1 | 0 | 0 | 0 |
| 3 | 1 | 1 | 0 | 0 | 0 | 1 | 0 | 0 | 0 | 1 |
| 4 | 0 | 0 | 1 | 0 | 0 | 1 | 1 | 0 | 1 | 1 |
| 5 | 1 | 0 | 1 | 0 | 0 | 1 | 0 | 0 | 0 | 1 |
| 7 | 1 | 1 | 1 | 0 | 0 | 1 | 0 | 1 | 0 | 0 |
| 8 | 0 | 0 | 0 | 1 | 0 | 1 | 1 | 1 | 0 | 0 |
| 13 | 1 | 0 | 1 | 1 | 0 | 1 | 0 | 1 | 0 | 1 |
| 16 | 0 | 0 | 0 | 0 | 1 | 1 | 1 | 0 | 0 | 0 |
| 17 | 1 | 0 | 0 | 0 | 1 | 1 | 1 | 1 | 0 | 0 |
| 18 | 0 | 1 | 0 | 0 | 1 | 1 | 1 | 1 | 0 | 1 |
| 19 | 1 | 1 | 0 | 0 | 1 | 1 | 0 | 1 | 0 | 0 |
| 20 | 0 | 0 | 1 | 0 | 1 | 1 | 0 | 1 | 1 | 1 |
| 21 | 1 | 0 | 1 | 0 | 1 | 1 | 0 | 1 | 0 | 1 |
| 22 | 0 | 1 | 1 | 0 | 1 | 1 | 0 | 0 | 1 | 1 |
| 24 | 0 | 0 | 0 | 1 | 1 | 1 | 0 | 1 | 0 | 0 |
| 25 | 1 | 0 | 0 | 1 | 1 | 1 | 1 | 0 | 0 | 1 |
| 26 | 0 | 1 | 0 | 1 | 1 | 1 | 1 | 0 | 1 | 0 |
| 27 | 1 | 1 | 0 | 1 | 1 | 1 | 1 | 1 | 0 | 1 |
| 28 | 0 | 0 | 1 | 1 | 1 | 0 | 0 | 1 | 0 | 0 |
| 29 | 1 | 0 | 1 | 1 | 1 | 1 | 1 | 1 | 0 | 0 |
| 30 | 0 | 1 | 1 | 1 | 1 | 1 | 1 | 1 | 1 | 0 |
| 31 | 1 | 1 | 1 | 1 | 1 | 1 | 1 | 1 | 1 | 1 |

With reference to Table 4, the generator matrix $g_1$ includes only the rows of the numbers included in the row set 1 of Table 3 in the generator matrix G of Table 1. Table 5 shows the generator matrix $g_2$.

TABLE 5

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 0 | 0 | 0 | 0 | 0 | 0 | 1 | 0 | 0 | 0 | 0 |
| 1 | 1 | 0 | 0 | 0 | 0 | 1 | 0 | 0 | 0 | 0 |
| 4 | 0 | 0 | 1 | 0 | 0 | 1 | 1 | 0 | 1 | 1 |
| 5 | 1 | 0 | 1 | 0 | 0 | 1 | 0 | 0 | 0 | 1 |
| 7 | 1 | 1 | 1 | 0 | 0 | 1 | 0 | 1 | 0 | 0 |
| 8 | 0 | 0 | 0 | 1 | 0 | 1 | 0 | 1 | 1 | 0 |
| 10 | 0 | 1 | 0 | 1 | 0 | 1 | 1 | 0 | 1 | 1 |
| 11 | 1 | 1 | 0 | 1 | 0 | 1 | 0 | 0 | 1 | 1 |
| 12 | 0 | 0 | 1 | 1 | 0 | 1 | 0 | 1 | 1 | 0 |
| 13 | 1 | 0 | 1 | 1 | 0 | 1 | 0 | 1 | 0 | 1 |
| 14 | 0 | 1 | 1 | 1 | 0 | 1 | 0 | 0 | 0 | 1 |
| 15 | 1 | 1 | 1 | 1 | 0 | 1 | 1 | 1 | 1 | 1 |
| 17 | 1 | 0 | 0 | 0 | 1 | 1 | 1 | 1 | 0 | 0 |
| 18 | 0 | 1 | 0 | 0 | 1 | 1 | 1 | 1 | 0 | 1 |
| 19 | 1 | 1 | 0 | 0 | 1 | 1 | 0 | 1 | 1 | 0 |

TABLE 5-continued

| i | v₁ | v₂ | v₃ | v₄ | v₅ | v₆ | v₇ | v₈ | v₉ | v₁₀ |
|---|---|---|---|---|---|---|---|---|---|---|
| 20 | 0 | 0 | 1 | 0 | 1 | 1 | 0 | 1 | 1 | 1 |
| 21 | 1 | 0 | 1 | 0 | 1 | 1 | 0 | 1 | 0 | 1 |
| 22 | 0 | 1 | 1 | 0 | 1 | 1 | 0 | 0 | 1 | 1 |
| 23 | 1 | 1 | 1 | 0 | 1 | 1 | 0 | 1 | 1 | 1 |
| 25 | 1 | 0 | 0 | 1 | 1 | 1 | 1 | 1 | 0 | 1 |
| 26 | 0 | 1 | 0 | 1 | 1 | 1 | 1 | 0 | 1 | 0 |
| 28 | 0 | 0 | 1 | 1 | 1 | 1 | 0 | 0 | 1 | 0 |
| 30 | 0 | 1 | 1 | 1 | 1 | 1 | 1 | 1 | 1 | 0 |
| 31 | 1 | 1 | 1 | 1 | 1 | 1 | 1 | 1 | 1 | 1 |

With reference to Table 5, the generator matrix $g_2$ has a size of 24×10, and includes only the rows corresponding to the numbers included in the row set 2 in the generator matrix G of Table 1. Table 6 shows the generator matrix $g_3$.

TABLE 6

| i | v₁ | v₂ | v₃ | v₄ | v₅ | v₆ | v₇ | v₈ | v₉ | v₁₀ |
|---|---|---|---|---|---|---|---|---|---|---|
| 0 | 0 | 0 | 0 | 0 | 0 | 1 | 0 | 0 | 0 | 0 |
| 1 | 1 | 0 | 0 | 0 | 0 | 1 | 0 | 0 | 0 | 0 |
| 2 | 0 | 1 | 0 | 0 | 0 | 1 | 1 | 0 | 0 | 0 |
| 3 | 1 | 1 | 0 | 0 | 0 | 1 | 0 | 0 | 0 | 1 |
| 4 | 0 | 0 | 1 | 0 | 0 | 1 | 1 | 0 | 1 | 1 |
| 5 | 1 | 0 | 1 | 0 | 0 | 1 | 0 | 0 | 0 | 1 |
| 6 | 0 | 1 | 1 | 0 | 0 | 1 | 0 | 0 | 1 | 0 |
| 8 | 0 | 0 | 0 | 1 | 0 | 1 | 0 | 1 | 1 | 0 |
| 9 | 1 | 0 | 0 | 1 | 0 | 1 | 1 | 1 | 1 | 0 |
| 14 | 0 | 1 | 1 | 1 | 0 | 1 | 1 | 0 | 0 | 1 |
| 16 | 0 | 0 | 0 | 0 | 1 | 1 | 1 | 0 | 0 | 0 |
| 18 | 0 | 1 | 0 | 0 | 1 | 1 | 1 | 1 | 0 | 1 |
| 19 | 1 | 1 | 0 | 0 | 1 | 1 | 1 | 0 | 1 | 0 |
| 20 | 0 | 0 | 1 | 0 | 1 | 1 | 0 | 1 | 1 | 1 |
| 21 | 1 | 0 | 1 | 0 | 1 | 1 | 0 | 1 | 0 | 1 |
| 22 | 0 | 1 | 1 | 0 | 1 | 1 | 0 | 0 | 1 | 1 |
| 23 | 1 | 1 | 1 | 0 | 1 | 1 | 0 | 1 | 1 | 1 |
| 24 | 0 | 0 | 0 | 1 | 1 | 1 | 0 | 1 | 0 | 0 |
| 26 | 0 | 1 | 0 | 1 | 1 | 1 | 1 | 0 | 1 | 0 |
| 27 | 1 | 1 | 0 | 1 | 1 | 1 | 1 | 0 | 0 | 1 |
| 28 | 0 | 0 | 1 | 1 | 1 | 1 | 0 | 0 | 1 | 0 |
| 29 | 1 | 0 | 1 | 1 | 1 | 1 | 1 | 1 | 0 | 0 |
| 30 | 0 | 1 | 1 | 1 | 1 | 1 | 1 | 1 | 1 | 0 |
| 31 | 1 | 1 | 1 | 1 | 1 | 1 | 1 | 1 | 1 | 1 |

With reference to Table 6, the generator matrix $g_3$ has a size of 24×10, and includes only the rows corresponding to the numbers included in the row set 3 in the generator matrix G of Table 1. Table 7 shows the generator matrix $g_4$.

TABLE 7

| i | v₁ | v₂ | v₃ | v₄ | v₅ | v₆ | v₇ | v₈ | v₉ | v₁₀ |
|---|---|---|---|---|---|---|---|---|---|---|
| 0 | 0 | 0 | 0 | 0 | 0 | 1 | 0 | 0 | 0 | 0 |
| 1 | 1 | 0 | 0 | 0 | 0 | 1 | 0 | 0 | 0 | 0 |
| 2 | 0 | 1 | 0 | 0 | 0 | 1 | 1 | 0 | 0 | 0 |
| 5 | 1 | 0 | 1 | 0 | 0 | 1 | 0 | 0 | 0 | 1 |
| 6 | 0 | 1 | 1 | 0 | 0 | 1 | 0 | 0 | 1 | 0 |
| 8 | 0 | 0 | 0 | 1 | 0 | 1 | 0 | 1 | 1 | 0 |
| 9 | 1 | 0 | 0 | 1 | 0 | 1 | 1 | 1 | 1 | 0 |
| 11 | 1 | 1 | 0 | 1 | 0 | 1 | 0 | 0 | 1 | 1 |
| 12 | 0 | 0 | 1 | 1 | 0 | 1 | 0 | 1 | 1 | 0 |
| 13 | 1 | 0 | 1 | 1 | 0 | 1 | 0 | 1 | 0 | 1 |
| 14 | 0 | 1 | 1 | 1 | 0 | 1 | 1 | 0 | 0 | 1 |
| 15 | 1 | 1 | 1 | 1 | 0 | 1 | 1 | 1 | 1 | 0 |
| 16 | 0 | 0 | 0 | 0 | 1 | 1 | 1 | 0 | 0 | 0 |
| 17 | 1 | 0 | 0 | 0 | 1 | 1 | 1 | 1 | 0 | 0 |
| 19 | 1 | 1 | 0 | 0 | 1 | 1 | 1 | 0 | 1 | 0 |
| 20 | 0 | 0 | 1 | 0 | 1 | 1 | 0 | 1 | 1 | 1 |
| 21 | 1 | 0 | 1 | 0 | 1 | 1 | 0 | 1 | 0 | 1 |
| 22 | 0 | 1 | 1 | 0 | 1 | 1 | 0 | 0 | 1 | 1 |
| 23 | 1 | 1 | 1 | 0 | 1 | 1 | 0 | 1 | 1 | 1 |
| 24 | 0 | 0 | 0 | 1 | 1 | 1 | 0 | 1 | 0 | 0 |

TABLE 7-continued

| i | v₁ | v₂ | v₃ | v₄ | v₅ | v₆ | v₇ | v₈ | v₉ | v₁₀ |
|---|---|---|---|---|---|---|---|---|---|---|
| 25 | 1 | 0 | 0 | 1 | 1 | 1 | 1 | 1 | 0 | 1 |
| 27 | 1 | 1 | 0 | 1 | 1 | 1 | 1 | 0 | 0 | 1 |
| 28 | 0 | 0 | 1 | 1 | 1 | 1 | 0 | 0 | 1 | 0 |
| 30 | 0 | 1 | 1 | 1 | 1 | 1 | 1 | 1 | 1 | 0 |

With reference to Table 7, the generator matrix $g_4$ has a size of 24×10, and includes only the rows corresponding to the numbers included in the row set 4 in the generator matrix G of Table 1. The row sets 1 to 4 used for generating codewords are merely illustrative. That is, any other row sets may be possible and the generator matrixes $g_1$ to $g_4$ may have various sizes.

Generating by the codeword generator 110 codewords by using only some of the rows of the generator matrix G means generating codewords with variable lengths. In the case of generating codewords in this manner, the performance may vary depending on how the row sets are made. Thus, a method for obtaining row sets (i.e., index sets) to achieve sufficient performance is required.

Hereinafter, the method of obtaining row sets used for generating codewords in the generator matrix G will now be described.

For example, row sets may be obtained based on the size of a minimum distance between codewords. The difference between the sizes of codewords is called a distance, and the smallest one of distances between codewords is called a minimum distance. The minimum distance is one of characteristics that significantly affects the performance of block coding. As the value of the minimum distance increases, the performance of block coding is improved. Thus, the row sets should render the minimum distance between codewords maximized.

In this respect, however, a row set having a maximized minimum distance may vary according to the lengths of inputted information bits, so the row set is selected such that the sum of minimum distances between codewords according to the length of each information bit is maximized. This will now be described in detail.

First, the number of sets of selecting r number of rows from among i number of rows in the generator matrix may be represented by Equation 5 shown below:

MathFigure 5

$$_iC_r = \frac{i!}{(i-r)!r!} \quad \text{[Math. 5]}$$

For example, if the number of rows of the generator matrix G is 32 and the number of rows used for generating a codeword is 24, the row sets according to input information bits with a single length would be $$_{32}C_{24} = \frac{32!}{(32-24)!24!} = 10{,}518{,}300$$

Accordingly, there could be considerably many row sets generating codewords having the same minimum distance. In addition, it is difficult to select a row set in which a minimum distance between codewords is maximum for each length of inputted information bits. Thus, by employing the condition in which the sum of the minimum distances between codewords according to the lengths of information bits is maximized, a row set exhibiting good performance over the information bits with various lengths can be obtained from numerous row sets.

Table 8 below shows row sets obtained by using a minimum distance when the lengths of information bits vary from 5 bits to 10 bits.

TABLE 8

| 0 | 1 | 2 | 3 | 4 | 5 | 7 | 8 | 13 | 16 | 17 | 18 | 19 | 20 | 21 | 22 | 24 | 25 | 26 | 27 | 28 | 29 | 30 | 31 |
|---|---|---|---|---|---|---|---|----|----|----|----|----|----|----|----|----|----|----|----|----|----|----|----|
| 0 | 1 | 2 | 3 | 4 | 5 | 7 | 9 | 10 | 13 | 14 | 15 | 16 | 17 | 20 | 22 | 24 | 25 | 26 | 27 | 28 | 29 | 30 | 31 |
| 1 | 2 | 4 | 5 | 6 | 7 | 8 | 9 | 10 | 11 | 13 | 17 | 18 | 19 | 20 | 21 | 22 | 24 | 25 | 26 | 28 | 29 | 30 | 31 |
| 1 | 2 | 3 | 6 | 7 | 8 | 9 | 11 | 12 | 13 | 14 | 15 | 16 | 17 | 18 | 19 | 21 | 23 | 25 | 26 | 28 | 29 | 30 | 31 |
| 0 | 1 | 2 | 4 | 6 | 8 | 9 | 11 | 12 | 13 | 14 | 15 | 17 | 18 | 20 | 21 | 22 | 23 | 24 | 26 | 28 | 29 | 30 | 31 |
| 1 | 2 | 3 | 4 | 7 | 8 | 9 | 11 | 12 | 13 | 14 | 15 | 16 | 17 | 18 | 20 | 21 | 23 | 24 | 26 | 28 | 29 | 30 | 31 |
| 0 | 2 | 5 | 6 | 7 | 8 | 9 | 10 | 12 | 13 | 14 | 15 | 17 | 18 | 21 | 22 | 23 | 24 | 25 | 26 | 27 | 29 | 30 | 31 |
| 0 | 1 | 2 | 5 | 6 | 7 | 8 | 10 | 11 | 15 | 16 | 17 | 18 | 19 | 20 | 21 | 22 | 24 | 25 | 26 | 27 | 29 | 30 | 31 |
| 0 | 2 | 3 | 4 | 5 | 6 | 7 | 8 | 9 | 11 | 13 | 15 | 16 | 17 | 19 | 20 | 21 | 24 | 25 | 26 | 27 | 29 | 30 | 31 |
| 0 | 2 | 3 | 5 | 6 | 7 | 8 | 9 | 11 | 13 | 14 | 15 | 17 | 18 | 19 | 20 | 22 | 23 | 25 | 26 | 27 | 29 | 30 | 31 |
| 0 | 1 | 2 | 3 | 6 | 7 | 8 | 9 | 10 | 11 | 12 | 13 | 14 | 15 | 16 | 17 | 19 | 20 | 23 | 25 | 27 | 29 | 30 | 31 |
| 0 | 3 | 4 | 5 | 7 | 8 | 9 | 11 | 12 | 13 | 14 | 15 | 16 | 17 | 19 | 20 | 21 | 22 | 23 | 25 | 26 | 29 | 30 | 31 |
| 1 | 2 | 3 | 4 | 5 | 8 | 9 | 10 | 11 | 13 | 14 | 15 | 16 | 18 | 19 | 20 | 23 | 24 | 25 | 26 | 27 | 28 | 30 | 31 |
| 0 | 1 | 2 | 4 | 5 | 7 | 8 | 10 | 11 | 12 | 13 | 16 | 17 | 18 | 20 | 21 | 22 | 23 | 24 | 25 | 26 | 28 | 30 | 31 |
| 0 | 1 | 2 | 4 | 5 | 8 | 9 | 10 | 11 | 13 | 14 | 15 | 17 | 18 | 19 | 21 | 22 | 23 | 24 | 25 | 26 | 28 | 30 | 31 |
| 0 | 1 | 4 | 5 | 7 | 8 | 10 | 11 | 12 | 13 | 14 | 15 | 17 | 18 | 19 | 20 | 21 | 22 | 23 | 25 | 26 | 28 | 30 | 31 |
| 0 | 1 | 2 | 3 | 4 | 5 | 6 | 7 | 8 | 10 | 11 | 12 | 13 | 15 | 17 | 19 | 20 | 21 | 23 | 25 | 26 | 27 | 30 | 31 |
| 0 | 2 | 3 | 4 | 5 | 6 | 7 | 9 | 10 | 11 | 12 | 13 | 14 | 15 | 16 | 17 | 18 | 19 | 20 | 22 | 23 | 27 | 30 | 31 |
| 0 | 1 | 2 | 3 | 4 | 5 | 8 | 9 | 10 | 11 | 12 | 13 | 14 | 15 | 17 | 18 | 19 | 20 | 21 | 22 | 23 | 26 | 30 | 31 |
| 3 | 4 | 5 | 6 | 7 | 9 | 10 | 11 | 12 | 14 | 16 | 17 | 18 | 19 | 21 | 22 | 23 | 24 | 25 | 26 | 27 | 28 | 29 | 31 |
| 0 | 1 | 3 | 4 | 5 | 6 | 7 | 9 | 10 | 12 | 13 | 14 | 18 | 19 | 21 | 22 | 23 | 24 | 25 | 26 | 27 | 28 | 29 | 31 |
| 0 | 1 | 2 | 3 | 5 | 7 | 8 | 10 | 11 | 12 | 13 | 14 | 18 | 19 | 20 | 21 | 23 | 24 | 25 | 26 | 27 | 28 | 29 | 31 |
| 0 | 2 | 3 | 4 | 5 | 7 | 8 | 12 | 13 | 14 | 15 | 16 | 18 | 19 | 20 | 21 | 22 | 23 | 24 | 26 | 27 | 28 | 29 | 31 |
| 3 | 4 | 5 | 6 | 7 | 8 | 9 | 10 | 11 | 12 | 13 | 14 | 15 | 17 | 18 | 19 | 21 | 23 | 24 | 25 | 27 | 28 | 29 | 31 |
| 0 | 1 | 2 | 3 | 5 | 6 | 7 | 8 | 9 | 12 | 13 | 14 | 15 | 16 | 18 | 19 | 20 | 22 | 23 | 25 | 27 | 28 | 29 | 31 |
| 0 | 1 | 3 | 4 | 5 | 6 | 7 | 8 | 9 | 10 | 11 | 12 | 13 | 14 | 18 | 19 | 21 | 23 | 24 | 25 | 26 | 28 | 29 | 31 |
| 0 | 1 | 2 | 3 | 4 | 5 | 6 | 8 | 9 | 10 | 11 | 12 | 13 | 14 | 15 | 17 | 18 | 19 | 20 | 21 | 23 | 27 | 28 | 31 |
| 1 | 3 | 4 | 6 | 7 | 9 | 10 | 11 | 12 | 15 | 16 | 17 | 18 | 19 | 20 | 21 | 22 | 23 | 24 | 25 | 27 | 28 | 29 | 30 |
| 0 | 2 | 3 | 4 | 5 | 6 | 8 | 9 | 10 | 11 | 12 | 13 | 14 | 15 | 16 | 17 | 19 | 20 | 22 | 23 | 25 | 27 | 28 | 30 |
| 0 | 1 | 2 | 5 | 6 | 7 | 8 | 10 | 11 | 14 | 15 | 16 | 17 | 18 | 19 | 20 | 21 | 23 | 24 | 25 | 26 | 27 | 28 | 29 |
| 1 | 2 | 3 | 5 | 6 | 7 | 8 | 9 | 11 | 12 | 13 | 14 | 16 | 17 | 18 | 19 | 21 | 23 | 24 | 25 | 26 | 27 | 28 | 29 |

With reference to Table 8, the rows included in each row set are shown by numbers. The row sets totals to 31. For example, a first row set includes the 0, 1, 2, 3, 4, 5, 7, 8, 13, 16, 17, 18, 19, 20, 21, 22, 24, 25, 26, 27, 28, 29, 30, 31$^{st}$ rows of the generator matrix G. When the generator matrix according to the first row set is $g_1$, codewords generated by the generator matrix $g_1$ are $[b_0, b_1, b_2, b_3, b_4, b_5, b_7, b_8, b_{13}, b_{16}, b_{17}, b_{18}, b_{19}, b_{20}, b_{21}, b_{22}, b_{24}, b_{25}, b_{26}, b_{27}, b_{2s}, b_{29}, b_{30}, b_{31}]$.

For another example, row sets may be obtained based on the size of a probability of undetected error of a codeword.

The probability of undetected error is a probability of detecting a codeword as a different codeword due to an error generated during the transmission of the codeword. Namely, a transmission error has occurred but the receiver fails to recognize the error and detects a corresponding codeword as a different codeword. The probability of undetected error is obtained by the number of 1, namely a weight distribution value, in the codewords according to each row set. The lower the probability of undetected error, the better the performance of block coding.

A row set for producing a codeword such that its probability of undetected error is minimized may vary depending on the lengths of information bits. The probability of undetected error may be represented by Equation 6 shown below:

$$P_u(E) = \sum_{j=1}^{n} A_j p^j (1-p)^{n-j}$$ [Equation 6]

wherein $P_u(E)$ is the probability of undetected error, $A_1, A_2, \ldots, A_n$ represent the weight distribution of codewords, and p is the transition probability in a binary symmetric channel (BSC). In Table 1, if it is assumed that p is 0.01 and the lengths (k) of information bits are 5 bits to 10 bits, the weight distribution of each bit of the codewords generated by the generator matrix g and the probability of undetected error $P_u$ are as shown in Tables 9 to 14. The first column (index) in the Tables 9 to 14 is the indexes of a generator matrix g according to the respective row sets.

Table 9 below shows the probability of undetected error of codewords according to each generator matrix g when the length (k) of the information bits is 5.

TABLE 9

| k = 5 | | | | | |
|---|---|---|---|---|---|
| index | 0 | 10 | 12 | 14 | Pu |
| 1 | 1 | 7 | 19 | 5 | 6.0829E−20 |
| 2 | 1 | 7 | 19 | 5 | 6.0829E−20 |
| 3 | 1 | 7 | 19 | 5 | 6.0829E−20 |
| 4 | 1 | 7 | 19 | 5 | 6.0829E−20 |
| 5 | 1 | 7 | 19 | 5 | 6.0829E−20 |
| 6 | 1 | 7 | 19 | 5 | 6.0829E−20 |
| 7 | 1 | 7 | 19 | 5 | 6.0829E−20 |
| 8 | 1 | 7 | 19 | 5 | 6.0829E−20 |
| 9 | 1 | 7 | 19 | 5 | 6.0829E−20 |
| 10 | 1 | 7 | 19 | 5 | 6.0829E−20 |
| 11 | 1 | 7 | 19 | 5 | 6.0829E−20 |
| 12 | 1 | 7 | 19 | 5 | 6.0829E−20 |
| 13 | 1 | 7 | 19 | 5 | 6.0829E−20 |
| 14 | 1 | 7 | 19 | 5 | 6.0829E−20 |
| 15 | 1 | 7 | 19 | 5 | 6.0829E−20 |
| 16 | 1 | 7 | 19 | 5 | 6.0829E−20 |
| 17 | 1 | 7 | 19 | 5 | 6.0829E−20 |
| 18 | 1 | 7 | 19 | 5 | 6.0829E−20 |
| 19 | 1 | 7 | 19 | 5 | 6.0829E−20 |
| 20 | 1 | 3 | 19 | 9 | 2.60792E−20 |
| 21 | 1 | 3 | 19 | 9 | 2.60792E−20 |

TABLE 9-continued

| | | | k = 5 | | |
|---|---|---|---|---|---|
| index | 0 | 10 | 12 | 14 | P u |
| 22 | 1 | 3 | 19 | 9 | 2.60792E−20 |
| 23 | 1 | 3 | 19 | 9 | 2.60792E−20 |
| 24 | 1 | 3 | 19 | 9 | 2.60792E−20 |
| 25 | 1 | 3 | 19 | 9 | 2.60792E−20 |
| 26 | 1 | 3 | 19 | 9 | 2.60792E−20 |
| 27 | 1 | 3 | 19 | 9 | 2.60792E−20 |
| 28 | 1 | 7 | 19 | 5 | 6.0829E−20 |
| 29 | 1 | 7 | 19 | 5 | 6.0829E−20 |
| 30 | 1 | 3 | 19 | 9 | 2.60792E−20 |
| 31 | 1 | 3 | 19 | 9 | 2.60792E−20 |

With reference to Table 9, the first column (index) is the indexes ($g_1$ to $g_{31}$) of each generator matrix g according to row sets in Table 8. The second to fifth columns indicate the number of codewords including I 1 by the number 0, 10, 12 and 14 (namely, the codewords including zero number of 1 (none), ten number of 1, twelve number of 1, and fourteen number of 1), upon inspecting the codewords generated by the generator matrixes $g_1$ to $g_{31}$. The sixth column indicates the probability of undetected error of the codewords generated by each generator matrix g. For example, among the codewords generated by the generator matrix $g_1$, there are one codeword in which the number of 1 is 0, seven codewords in which the number of 1 is 10, nineteen codewords in which the number of 1 is 12, and five codewords in which the number of 1 is 14. Thus, the probability of undetected error of the codewords generated by the generator matrix $g_1$ is $6.0829 10^{-20}$.

Meanwhile, among the codewords generated by the generator matrix $g_{20}$, there are one codeword in which the number of 1 is 0, three codewords in which the number of 1 is 10, nineteen codewords in which the number of 1 is 12, and nine codewords in which the number of 1 is 14. Thus, the probability of undetected error of the codewords generated by the generator matrix $g_1$ is $2.60792 10^{-20}$, which is smaller than the probability of undetected error of the codewords generated by the generator matrix $g_1$.

The probabilities of undetected error of codewords according to the generator matrixes $g_{20}$, $g_{27}$, $g_{30}$, and $g_{31}$ are $2.60792 10^{-20}$, and those of codewords of the generator matrixes of the other remaining indexes are $6.0829 10^{-20}$, higher.

Table 10 below shows the weight distributions and the probabilities of undetected error of codewords generated by the generator matrix g when the length (k) of the information bits is 6.

TABLE 10

| | | | k = 6 | | | |
|---|---|---|---|---|---|---|
| index | 0 | 10 | 12 | 14 | 24 | P u |
| 1 | 1 | 12 | 38 | 12 | 1 | 1.0428E−19 |
| 2 | 1 | 12 | 38 | 12 | 1 | 1.0428E−19 |
| 3 | 1 | 12 | 38 | 12 | 1 | 1.0428E−19 |
| 4 | 1 | 12 | 38 | 12 | 1 | 1.0428E−19 |
| 5 | 1 | 12 | 38 | 12 | 1 | 1.0428E−19 |
| 6 | 1 | 12 | 38 | 12 | 1 | 1.0428E−19 |
| 7 | 1 | 12 | 38 | 12 | 1 | 1.0428E−19 |
| 8 | 1 | 12 | 38 | 12 | 1 | 1.0428E−19 |
| 9 | 1 | 12 | 38 | 12 | 1 | 1.0428E−19 |
| 10 | 1 | 12 | 38 | 12 | 1 | 1.0428E−19 |
| 11 | 1 | 12 | 38 | 12 | 1 | 1.0428E−19 |
| 12 | 1 | 12 | 38 | 12 | 1 | 1.0428E−19 |
| 13 | 1 | 12 | 38 | 12 | 1 | 1.0428E−19 |
| 14 | 1 | 12 | 38 | 12 | 1 | 1.0428E−19 |

TABLE 10-continued

| | | | k = 6 | | | |
|---|---|---|---|---|---|---|
| index | 0 | 10 | 12 | 14 | 24 | P u |
| 15 | 1 | 12 | 38 | 12 | 1 | 1.0428E−19 |
| 16 | 1 | 12 | 38 | 12 | 1 | 1.0428E−19 |
| 17 | 1 | 12 | 38 | 12 | 1 | 1.0428E−19 |
| 18 | 1 | 12 | 38 | 12 | 1 | 1.0428E−19 |
| 19 | 1 | 12 | 38 | 12 | 1 | 1.0428E−19 |
| 20 | 1 | 12 | 38 | 12 | 1 | 1.0428E−19 |
| 21 | 1 | 12 | 38 | 12 | 1 | 1.0428E−19 |
| 22 | 1 | 12 | 38 | 12 | 1 | 1.0428E−19 |
| 23 | 1 | 12 | 38 | 12 | 1 | 1.0428E−19 |
| 24 | 1 | 12 | 38 | 12 | 1 | 1.0428E−19 |
| 25 | 1 | 12 | 38 | 12 | 1 | 1.0428E−19 |
| 26 | 1 | 12 | 38 | 12 | 1 | 1.0428E−19 |
| 27 | 1 | 12 | 38 | 12 | 1 | 1.0428E−19 |
| 28 | 1 | 12 | 38 | 12 | 1 | 1.0428E−19 |
| 29 | 1 | 12 | 38 | 12 | 1 | 1.0428E−19 |
| 30 | 1 | 12 | 38 | 12 | 1 | 1.0428E−19 |
| 31 | 1 | 12 | 38 | 12 | 1 | 1.0428E−19 |

With reference to Table 10, the probabilities of undetected error with respect to the codewords generated by the generator matrix g of the every index are the same as $1.042810^{-19}$.

Table 11 below shows the weight distributions and the probabilities of undetected error of codewords generated by the generator matrix g when the length (k) of the information bits is 7.

TABLE 11

| | | | | k = 7 | | | | |
|---|---|---|---|---|---|---|---|---|
| index | 0 | 8 | 10 | 12 | 14 | 16 | 24 | P u |
| 1 | 1 | 8 | 28 | 54 | 28 | 8 | 1 | 6.8141E−16 |
| 2 | 1 | 9 | 24 | 60 | 24 | 9 | 1 | 7.6652E−16 |
| 3 | 1 | 9 | 24 | 60 | 24 | 9 | 1 | 7.6652E−16 |
| 4 | 1 | 9 | 24 | 60 | 24 | 9 | 1 | 7.6652E−16 |
| 5 | 1 | 8 | 28 | 54 | 28 | 8 | 1 | 6.8141E−16 |
| 6 | 1 | 9 | 24 | 60 | 24 | 9 | 1 | 7.6652E−16 |
| 7 | 1 | 9 | 24 | 60 | 24 | 9 | 1 | 7.6652E−16 |
| 8 | 1 | 8 | 28 | 54 | 28 | 8 | 1 | 6.8141E−16 |
| 9 | 1 | 8 | 28 | 54 | 28 | 8 | 1 | 6.8141E−16 |
| 10 | 1 | 9 | 24 | 60 | 24 | 9 | 1 | 7.6652E−16 |
| 11 | 1 | 9 | 24 | 60 | 24 | 9 | 1 | 7.6652E−16 |
| 12 | 1 | 9 | 24 | 60 | 24 | 9 | 1 | 7.6652E−16 |
| 13 | 1 | 9 | 24 | 60 | 24 | 9 | 1 | 7.6652E−16 |
| 14 | 1 | 9 | 24 | 60 | 24 | 9 | 1 | 7.6652E−16 |
| 15 | 1 | 9 | 24 | 60 | 24 | 9 | 1 | 7.6652E−16 |
| 16 | 1 | 8 | 28 | 54 | 28 | 8 | 1 | 6.8141E−16 |
| 17 | 1 | 9 | 24 | 60 | 24 | 9 | 1 | 7.6652E−16 |
| 18 | 1 | 9 | 24 | 60 | 24 | 9 | 1 | 7.6652E−16 |
| 19 | 1 | 9 | 24 | 60 | 24 | 9 | 1 | 7.6652E−16 |
| 20 | 1 | 8 | 28 | 54 | 28 | 8 | 1 | 6.8141E−16 |
| 21 | 1 | 9 | 24 | 60 | 24 | 9 | 1 | 7.6652E−16 |
| 22 | 1 | 9 | 24 | 60 | 24 | 9 | 1 | 7.6652E−16 |
| 23 | 1 | 9 | 24 | 60 | 24 | 9 | 1 | 7.6652E−16 |
| 24 | 1 | 8 | 28 | 54 | 28 | 8 | 1 | 6.8141E−16 |
| 25 | 1 | 9 | 24 | 60 | 24 | 9 | 1 | 7.6652E−16 |
| 26 | 1 | 9 | 24 | 60 | 24 | 9 | 1 | 7.6652E−16 |
| 27 | 1 | 9 | 24 | 60 | 24 | 9 | 1 | 7.6652E−16 |
| 28 | 1 | 9 | 24 | 60 | 24 | 9 | 1 | 7.6652E−16 |
| 29 | 1 | 8 | 28 | 54 | 28 | 8 | 1 | 6.8141E−16 |
| 30 | 1 | 8 | 28 | 54 | 28 | 8 | 1 | 6.8141E−16 |
| 31 | 1 | 9 | 24 | 60 | 24 | 9 | 1 | 7.6652E−16 |

With reference to Table 11, the probabilities of undetected error of codewords generated by the generator matrixes $g_1$, $g_5$, $g_8$, $g_9$, $g_{16}$, $g_{20}$, $g_{24}$, $g_{29}$, $g_{30}$ are $6.814110^{-16}$, and those of codewords generated by the generator matrixes of the other remaining indexes are $7.665210^{-16}$.

Table 12 below shows the weight distributions and the probabilities of undetected error of codewords generated by the generator matrix g when the length (k) of the information bits is 8.

TABLE 12 k = 8

| index | 0 | 8 | 10 | 12 | 14 | 16 | 24 | P u |
|---|---|---|---|---|---|---|---|---|
| 1 | 1 | 25 | 56 | 92 | 56 | 25 | 1 | 2.12913E−15 |
| 2 | 1 | 27 | 48 | 104 | 48 | 27 | 1 | 2.29935E−15 |
| 3 | 1 | 25 | 56 | 92 | 56 | 25 | 1 | 2.12913E−15 |
| 4 | 1 | 25 | 56 | 92 | 56 | 25 | 1 | 2.12913E−15 |
| 5 | 1 | 25 | 56 | 92 | 56 | 25 | 1 | 2.12913E−15 |
| 6 | 1 | 27 | 48 | 104 | 48 | 27 | 1 | 2.29935E−15 |
| 7 | 1 | 27 | 48 | 104 | 48 | 27 | 1 | 2.29935E−15 |
| 8 | 1 | 25 | 56 | 92 | 56 | 25 | 1 | 2.12913E−15 |
| 9 | 1 | 25 | 56 | 92 | 56 | 25 | 1 | 2.12913E−15 |
| 10 | 1 | 27 | 48 | 104 | 48 | 27 | 1 | 2.29935E−15 |
| 11 | 1 | 27 | 48 | 104 | 48 | 27 | 1 | 2.29935E−15 |
| 12 | 1 | 27 | 48 | 104 | 48 | 27 | 1 | 2.29935E−15 |
| 13 | 1 | 27 | 48 | 104 | 48 | 27 | 1 | 2.29935E−15 |
| 14 | 1 | 27 | 48 | 104 | 48 | 27 | 1 | 2.29935E−15 |
| 15 | 1 | 27 | 48 | 104 | 48 | 27 | 1 | 2.29935E−15 |
| 16 | 1 | 25 | 56 | 92 | 56 | 25 | 1 | 2.12913E−15 |
| 17 | 1 | 27 | 48 | 104 | 48 | 27 | 1 | 2.29935E−15 |
| 18 | 1 | 27 | 48 | 104 | 48 | 27 | 1 | 2.29935E−15 |
| 19 | 1 | 27 | 48 | 104 | 48 | 27 | 1 | 2.29935E−15 |
| 20 | 1 | 25 | 56 | 92 | 56 | 25 | 1 | 2.12913E−15 |
| 21 | 1 | 27 | 48 | 104 | 48 | 27 | 1 | 2.29935E−15 |
| 22 | 1 | 27 | 48 | 104 | 48 | 27 | 1 | 2.29935E−15 |
| 23 | 1 | 27 | 48 | 104 | 48 | 27 | 1 | 2.29935E−15 |
| 24 | 1 | 25 | 56 | 92 | 56 | 25 | 1 | 2.12913E−15 |
| 25 | 1 | 25 | 56 | 92 | 56 | 25 | 1 | 2.12913E−15 |
| 26 | 1 | 27 | 48 | 104 | 48 | 27 | 1 | 2.29935E−15 |
| 27 | 1 | 27 | 48 | 104 | 48 | 27 | 1 | 2.29935E−15 |
| 28 | 1 | 25 | 56 | 92 | 56 | 25 | 1 | 2.12913E−15 |
| 29 | 1 | 25 | 56 | 92 | 56 | 25 | 1 | 2.12913E−15 |
| 30 | 1 | 25 | 56 | 92 | 56 | 25 | 1 | 2.12913E−15 |
| 31 | 1 | 25 | 56 | 92 | 56 | 25 | 1 | 2.12913E−15 |

With reference to Table 12, the probabilities of undetected error of codewords generated by the generator matrixes $g_1$, $g_3$, $g_4$, $g_5$, $g_8$, $g_9$, $g_{16}$, $g_{20}$, $g_{24}$, $g_{25}$, $g_{28}$, $g_{29}$, $g_{30}$, $g_{31}$ are $2.12913 \times 10^{-15}$, and those of codewords generated by the generator matrixes of the other remaining indexes are $2.29935 \times 10^{-15}$.

Table 13 below shows the weight distributions and the probabilities of undetected error of codewords generated by the generator matrix g when the length (k) of the information bits is 9.

TABLE 13 k = 9

| index | 0 | 8 | 10 | 12 | 14 | 16 | 24 | P u |
|---|---|---|---|---|---|---|---|---|
| 1 | 1 | 59 | 112 | 168 | 112 | 59 | 1 | 5.02457E−15 |
| 2 | 1 | 63 | 96 | 192 | 96 | 63 | 1 | 5.36502E−15 |
| 3 | 1 | 59 | 112 | 168 | 112 | 59 | 1 | 5.02457E−15 |
| 4 | 1 | 59 | 112 | 168 | 112 | 59 | 1 | 5.02457E−15 |
| 5 | 1 | 59 | 112 | 168 | 112 | 59 | 1 | 5.02457E−15 |
| 6 | 1 | 63 | 96 | 192 | 96 | 63 | 1 | 5.36502E−15 |
| 7 | 1 | 63 | 96 | 192 | 96 | 63 | 1 | 5.36502E−15 |
| 8 | 1 | 59 | 112 | 168 | 112 | 59 | 1 | 5.02457E−15 |
| 9 | 1 | 59 | 112 | 168 | 112 | 59 | 1 | 5.02457E−15 |
| 10 | 1 | 59 | 112 | 168 | 112 | 59 | 1 | 5.02457E−15 |
| 11 | 1 | 59 | 112 | 168 | 112 | 59 | 1 | 5.02457E−15 |
| 12 | 1 | 63 | 96 | 192 | 96 | 63 | 1 | 5.36502E−15 |
| 13 | 1 | 63 | 96 | 192 | 96 | 63 | 1 | 5.36502E−15 |
| 14 | 1 | 59 | 112 | 168 | 112 | 59 | 1 | 5.02457E−15 |
| 15 | 1 | 59 | 112 | 168 | 112 | 59 | 1 | 5.02457E−15 |
| 16 | 1 | 59 | 112 | 168 | 112 | 59 | 1 | 5.02457E−15 |
| 17 | 1 | 63 | 96 | 192 | 96 | 63 | 1 | 5.36502E−15 |
| 18 | 1 | 59 | 112 | 168 | 112 | 59 | 1 | 5.02457E−15 |
| 19 | 1 | 59 | 112 | 168 | 112 | 59 | 1 | 5.02457E−15 |
| 20 | 1 | 59 | 112 | 168 | 112 | 59 | 1 | 5.02457E−15 |
| 21 | 1 | 63 | 96 | 192 | 96 | 63 | 1 | 5.36502E−15 |
| 22 | 1 | 59 | 112 | 168 | 112 | 59 | 1 | 5.02457E−15 |
| 23 | 1 | 63 | 96 | 192 | 96 | 63 | 1 | 5.36502E−15 |
| 24 | 1 | 59 | 112 | 168 | 112 | 59 | 1 | 5.02457E−15 |
| 25 | 1 | 59 | 112 | 168 | 112 | 59 | 1 | 5.02457E−15 |
| 26 | 1 | 63 | 96 | 192 | 96 | 63 | 1 | 5.36502E−15 |
| 27 | 1 | 63 | 96 | 192 | 96 | 63 | 1 | 5.36502E−15 |
| 28 | 1 | 59 | 112 | 168 | 112 | 59 | 1 | 5.02457E−15 |
| 29 | 1 | 59 | 112 | 168 | 112 | 59 | 1 | 5.02457E−15 |
| 30 | 1 | 59 | 112 | 168 | 112 | 59 | 1 | 5.02457E−15 |
| 31 | 1 | 59 | 112 | 168 | 112 | 59 | 1 | 5.02457E−15 |

With reference to Table 13, the probabilities of undetected error of codewords generated by the generator matrixes $g_2$, $g_6$, $g_7$, $g_{12}$, $g_{13}$, $g_{17}$, $g_{21}$, $g_{23}$, $g_{26}$, $g_{27}$ are $5.36502 \times 10^{-15}$, and those of codewords generated by the generator matrixes of the other remaining indexes are $5.02357 \times 10^{-15}$.

Table 14 below shows the weight distributions and the probabilities of undetected error of codewords generated by the generator matrix g when the length (k) of the information bits is 10.

TABLE 14 k = 10

| index | 0 | 7 | 8 | 9 | 10 | 11 | 12 | 13 | 14 | 15 | 16 | 17 | 24 | P u |
|---|---|---|---|---|---|---|---|---|---|---|---|---|---|---|
| 1 | 1 | 20 | 59 | 100 | 112 | 136 | 168 | 136 | 112 | 100 | 59 | 59 | 1 | 1.73699E−13 |
| 2 | 1 | 24 | 63 | 88 | 96 | 144 | 192 | 144 | 96 | 88 | 63 | 63 | 1 | 2.07747E−13 |
| 3 | 1 | 26 | 59 | 82 | 112 | 148 | 168 | 148 | 112 | 82 | 59 | 59 | 1 | 2.2426E−13 |
| 4 | 1 | 24 | 59 | 88 | 112 | 144 | 168 | 144 | 112 | 88 | 59 | 59 | 1 | 2.07407E−13 |
| 5 | 1 | 24 | 59 | 88 | 112 | 144 | 168 | 144 | 112 | 88 | 59 | 59 | 1 | 2.07407E−13 |
| 6 | 1 | 24 | 63 | 88 | 96 | 144 | 192 | 144 | 96 | 88 | 63 | 63 | 1 | 2.07747E−13 |
| 7 | 1 | 24 | 63 | 88 | 96 | 144 | 192 | 144 | 96 | 88 | 63 | 63 | 1 | 2.07747E−13 |
| 8 | 1 | 24 | 59 | 88 | 112 | 144 | 168 | 144 | 112 | 88 | 59 | 59 | 1 | 2.07407E−13 |
| 9 | 1 | 26 | 59 | 82 | 112 | 148 | 168 | 148 | 112 | 82 | 59 | 59 | 1 | 2.2426E−13 |
| 10 | 1 | 24 | 59 | 88 | 112 | 144 | 168 | 144 | 112 | 88 | 59 | 59 | 1 | 2.07407E−13 |
| 11 | 1 | 22 | 59 | 94 | 112 | 140 | 168 | 140 | 112 | 94 | 59 | 59 | 1 | 1.90553E−13 |
| 12 | 1 | 22 | 63 | 94 | 96 | 140 | 192 | 140 | 96 | 94 | 63 | 63 | 1 | 1.90893E−13 |
| 13 | 1 | 24 | 63 | 88 | 96 | 144 | 192 | 144 | 96 | 88 | 63 | 63 | 1 | 2.07747E−13 |
| 14 | 1 | 20 | 59 | 100 | 112 | 136 | 168 | 136 | 112 | 100 | 59 | 59 | 1 | 1.73699E−13 |
| 15 | 1 | 24 | 59 | 88 | 112 | 144 | 168 | 144 | 112 | 88 | 59 | 59 | 1 | 2.07407E−13 |
| 16 | 1 | 20 | 59 | 100 | 112 | 136 | 168 | 136 | 112 | 100 | 59 | 59 | 1 | 1.73699E−13 |
| 17 | 1 | 24 | 63 | 88 | 96 | 144 | 192 | 144 | 96 | 88 | 63 | 63 | 1 | 2.07747E−13 |

TABLE 14-continued k = 10

| index | 0 | 7 | 8 | 9 | 10 | 11 | 12 | 13 | 14 | 15 | 16 | 17 | 24 | P u |
|---|---|---|---|---|---|---|---|---|---|---|---|---|---|---|
| 18 | 1 | 24 | 59 | 88 | 112 | 144 | 168 | 144 | 112 | 88 | 59 | 59 | 1 | 2.07407E−13 |
| 19 | 1 | 22 | 59 | 94 | 112 | 140 | 168 | 140 | 112 | 94 | 59 | 59 | 1 | 1.90553E−13 |
| 20 | 1 | 24 | 59 | 88 | 112 | 144 | 168 | 144 | 112 | 88 | 59 | 59 | 1 | 2.07407E−13 |
| 21 | 1 | 24 | 63 | 88 | 96 | 144 | 192 | 144 | 96 | 88 | 63 | 63 | 1 | 2.07747E−13 |
| 22 | 1 | 24 | 59 | 88 | 112 | 144 | 168 | 144 | 112 | 88 | 59 | 59 | 1 | 2.07407E−13 |
| 23 | 1 | 22 | 63 | 94 | 96 | 140 | 192 | 140 | 96 | 94 | 63 | 63 | 1 | 1.90893E−13 |
| 24 | 1 | 26 | 59 | 82 | 112 | 148 | 168 | 148 | 112 | 82 | 59 | 59 | 1 | 2.2426E−13 |
| 25 | 1 | 24 | 59 | 88 | 112 | 144 | 168 | 144 | 112 | 88 | 59 | 59 | 1 | 2.07407E−13 |
| 26 | 1 | 24 | 63 | 88 | 96 | 144 | 192 | 144 | 96 | 88 | 63 | 63 | 1 | 2.07747E−13 |
| 27 | 1 | 24 | 63 | 88 | 96 | 144 | 192 | 144 | 96 | 88 | 63 | 63 | 1 | 2.07747E−13 |
| 28 | 1 | 24 | 59 | 88 | 112 | 144 | 168 | 144 | 112 | 88 | 59 | 59 | 1 | 2.07407E−13 |
| 29 | 1 | 24 | 59 | 88 | 112 | 144 | 168 | 144 | 112 | 88 | 59 | 59 | 1 | 2.07407E−13 |
| 30 | 1 | 22 | 59 | 94 | 112 | 140 | 168 | 140 | 112 | 94 | 59 | 59 | 1 | 1.90553E−13 |
| 31 | 1 | 22 | 59 | 94 | 112 | 140 | 168 | 140 | 112 | 94 | 59 | 59 | 1 | 1.90553E−13 |

With reference to Table 14, the probabilities of undetected error of the codewords generated by the generator matrixes $g_1$, $g_{14}$, $g_{16}$ are $1.7369910^{-13}$, which is the minimum probability of undetected error smaller than that of the codewords generated by the other remaining index generator matrixes.

As shown in Tables 9 to 14, the optimum row sets minimizing each probability of undetected error of codewords vary according to the lengths of information bits. Thus, the probabilities of undetected error of the codewords according to the row sets by the lengths are all added, and a row set having a relatively small sum of the probabilities of undetected error may be determined as an optimum row set.

Table 15 below shows values obtained by adding all the probabilities of undetected error of the respective bit indexes according to the respective information bit lengths.

TABLE 15

| index | P u Sum |
|---|---|
| 1 | 1.81535E−13 |
| 2 | 2.16178E−13 |
| 3 | 2.32181E−13 |
| 4 | 2.15327E−13 |
| 5 | 2.15242E−13 |
| 6 | 2.16178E−13 |
| 7 | 2.16178E−13 |
| 8 | 2.15242E−13 |
| 9 | 2.32096E−13 |
| 10 | 2.15497E−13 |
| 11 | 1.98644E−13 |
| 12 | 1.99324E−13 |
| 13 | 2.16178E−13 |
| 14 | 1.8179E−13 |
| 15 | 2.15497E−13 |
| 16 | 1.81535E−13 |
| 17 | 2.16178E−13 |
| 18 | 2.15497E−13 |
| 19 | 1.98644E−13 |
| 20 | 2.15242E−13 |
| 21 | 2.16178E−13 |
| 22 | 2.15497E−13 |
| 23 | 1.99324E−13 |
| 24 | 2.32096E−13 |
| 25 | 2.15327E−13 |
| 26 | 2.16178E−13 |
| 27 | 2.16178E−13 |
| 28 | 2.15327E−13 |
| 29 | 2.15242E−13 |
| 30 | 1.98388E−13 |
| 31 | 1.98473E−13 |

With reference to FIG. 15, the probabilities of undetected error of the codewords generated by the generator matrixes $g_1$ and $g_{16}$ are $1.8153510^{-13}$, the smallest.

For another example, the row sets may be obtained based on the size of the minimum distance between codewords and the size of probability of undetected error. Table 16 below shows row sets obtained in consideration of both the minimum distance and the probability of undetected error.

TABLE 16

| | row number | | | | | | | | | | |
|---|---|---|---|---|---|---|---|---|---|---|---|
| Row Set 1 | 0 | 1 | 2 | 3 | 4 | 5 | 7 | 8 | 13 | 16 | 17 | 18 |
| | 19 | 20 | 21 | 22 | 24 | 25 | 26 | 27 | 28 | 29 | 30 | 31 |
| Row Set 2 | 0 | 1 | 4 | 5 | 7 | 8 | 10 | 11 | 12 | 13 | 14 | 15 |
| | 17 | 18 | 19 | 20 | 21 | 22 | 23 | 25 | 26 | 28 | 30 | 31 |
| Row Set 3 | 0 | 1 | 2 | 3 | 4 | 5 | 6 | 8 | 9 | 14 | 16 | 18 |
| | 19 | 20 | 21 | 22 | 23 | 24 | 26 | 27 | 28 | 29 | 30 | 31 |
| Row Set 4 | 0 | 1 | 2 | 5 | 6 | 8 | 9 | 11 | 12 | 13 | 14 | 15 |
| | 16 | 17 | 19 | 20 | 21 | 22 | 23 | 24 | 25 | 27 | 28 | 30 |

Hereinafter, a generator matrix with a size of 30×10 will now be described. Codewords with a length of 30 can be generated from information bits with a length of 10 by using a generator matrix with a size of 30×10.

Table 17 below shows an example of the generator matrix with the size of 30×10.

TABLE 17

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 1 | 1 | 0 | 0 | 0 | 0 | 1 | 0 | 0 | 0 | 0 |
| 2 | 0 | 1 | 0 | 0 | 0 | 1 | 1 | 0 | 0 | 0 |
| 3 | 1 | 1 | 0 | 0 | 0 | 1 | 0 | 0 | 0 | 1 |
| 4 | 0 | 0 | 1 | 0 | 0 | 1 | 1 | 0 | 1 | 1 |
| 5 | 1 | 0 | 1 | 0 | 0 | 1 | 0 | 0 | 0 | 1 |
| 6 | 0 | 1 | 1 | 0 | 0 | 1 | 0 | 0 | 1 | 0 |
| 7 | 1 | 1 | 1 | 0 | 0 | 1 | 0 | 1 | 0 | 0 |
| 8 | 0 | 0 | 0 | 1 | 0 | 1 | 0 | 1 | 1 | 0 |
| 9 | 1 | 0 | 0 | 1 | 0 | 1 | 1 | 1 | 1 | 0 |
| 10 | 0 | 1 | 0 | 1 | 0 | 1 | 1 | 0 | 1 | 1 |
| 11 | 1 | 1 | 0 | 1 | 0 | 1 | 0 | 0 | 1 | 1 |
| 12 | 0 | 0 | 1 | 1 | 0 | 1 | 0 | 1 | 1 | 0 |
| 13 | 1 | 0 | 1 | 1 | 0 | 1 | 0 | 1 | 0 | 1 |
| 14 | 0 | 1 | 1 | 1 | 0 | 1 | 1 | 0 | 0 | 1 |
| 15 | 1 | 1 | 1 | 1 | 0 | 1 | 1 | 1 | 1 | 1 |
| 17 | 1 | 0 | 0 | 0 | 1 | 1 | 1 | 1 | 0 | 0 |
| 18 | 0 | 1 | 0 | 0 | 1 | 1 | 1 | 1 | 0 | 1 |
| 19 | 1 | 1 | 0 | 0 | 1 | 1 | 1 | 0 | 1 | 0 |
| 20 | 0 | 0 | 1 | 0 | 1 | 1 | 0 | 1 | 1 | 1 |
| 21 | 1 | 0 | 1 | 0 | 1 | 0 | 1 | 0 | 1 | 1 |
| 22 | 0 | 1 | 1 | 0 | 1 | 1 | 0 | 0 | 1 | 1 |
| 23 | 1 | 1 | 1 | 0 | 1 | 1 | 0 | 1 | 1 | 1 |
| 24 | 0 | 0 | 0 | 1 | 1 | 1 | 0 | 1 | 0 | 0 |
| 25 | 1 | 0 | 0 | 1 | 1 | 1 | 1 | 1 | 0 | 1 |

TABLE 17-continued

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 26 | 0 | 1 | 0 | 1 | 1 | 1 | 1 | 0 | 1 | 0 |
| 27 | 1 | 1 | 0 | 1 | 1 | 1 | 1 | 0 | 0 | 1 |
| 28 | 0 | 0 | 1 | 1 | 1 | 1 | 0 | 0 | 1 | 0 |
| 29 | 1 | 0 | 1 | 1 | 1 | 1 | 1 | 1 | 0 | 0 |
| 30 | 0 | 1 | 1 | 1 | 1 | 1 | 1 | 1 | 1 | 0 |
| 31 | 1 | 1 | 1 | 1 | 1 | 1 | 1 | 1 | 1 | 1 |

The generator matrix of Table 17 may be configured by selecting the 1, 2, 3, 4, 5, 6, 7, 8, 9, 10, 11, 12, 13, 14, 15, 17, 18, 19, 20, 21, 22, 23, 24, 25, 26, 27, 28, 29, 30, 31$^{st}$ rows of the generator matrix G of Table 1.

Table 18 below shows another example of the generator matrix with the size of 30×10.

TABLE 18

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 1 | 1 | 0 | 0 | 0 | 0 | 1 | 0 | 0 | 0 | 0 |
| 2 | 0 | 1 | 0 | 0 | 0 | 1 | 1 | 0 | 0 | 0 |
| 3 | 1 | 1 | 0 | 0 | 0 | 1 | 0 | 0 | 0 | 1 |
| 4 | 0 | 0 | 1 | 0 | 0 | 1 | 1 | 0 | 1 | 1 |
| 5 | 1 | 0 | 1 | 0 | 0 | 1 | 0 | 0 | 0 | 1 |
| 6 | 0 | 1 | 1 | 0 | 0 | 1 | 0 | 0 | 1 | 0 |
| 7 | 1 | 1 | 1 | 0 | 0 | 1 | 0 | 1 | 0 | 0 |
| 9 | 1 | 0 | 0 | 1 | 0 | 1 | 1 | 1 | 0 | 0 |
| 10 | 0 | 1 | 0 | 1 | 0 | 1 | 1 | 0 | 1 | 1 |
| 11 | 1 | 1 | 0 | 1 | 0 | 1 | 0 | 0 | 1 | 1 |
| 12 | 0 | 0 | 1 | 1 | 0 | 1 | 0 | 1 | 1 | 0 |
| 13 | 1 | 0 | 1 | 1 | 0 | 1 | 0 | 1 | 0 | 1 |
| 14 | 0 | 1 | 1 | 1 | 0 | 1 | 1 | 0 | 0 | 1 |
| 15 | 1 | 1 | 1 | 1 | 0 | 1 | 1 | 1 | 1 | 1 |
| 16 | 0 | 0 | 0 | 0 | 1 | 1 | 1 | 0 | 0 | 0 |
| 17 | 1 | 0 | 0 | 0 | 1 | 1 | 1 | 1 | 0 | 0 |
| 18 | 0 | 1 | 0 | 0 | 1 | 1 | 1 | 1 | 0 | 1 |
| 19 | 1 | 1 | 0 | 0 | 1 | 1 | 1 | 0 | 1 | 0 |
| 20 | 0 | 0 | 1 | 0 | 1 | 1 | 0 | 1 | 1 | 1 |
| 21 | 1 | 0 | 1 | 0 | 1 | 1 | 0 | 1 | 0 | 1 |
| 22 | 0 | 1 | 1 | 0 | 1 | 1 | 0 | 0 | 1 | 1 |
| 23 | 1 | 1 | 1 | 0 | 1 | 1 | 0 | 1 | 1 | 1 |
| 24 | 0 | 0 | 0 | 1 | 1 | 1 | 0 | 1 | 0 | 0 |
| 25 | 1 | 0 | 0 | 1 | 1 | 1 | 1 | 1 | 0 | 1 |
| 26 | 0 | 1 | 0 | 1 | 1 | 1 | 0 | 1 | 1 | 0 |
| 27 | 1 | 1 | 0 | 1 | 1 | 1 | 0 | 0 | 0 | 1 |
| 28 | 0 | 0 | 1 | 1 | 1 | 1 | 0 | 0 | 1 | 0 |
| 29 | 1 | 0 | 1 | 1 | 1 | 1 | 1 | 1 | 0 | 0 |
| 30 | 0 | 1 | 1 | 1 | 1 | 1 | 1 | 1 | 1 | 0 |
| 31 | 1 | 1 | 1 | 1 | 1 | 1 | 1 | 1 | 1 | 1 |

The generator matrix of Table 18 may be configured by selecting the 1, 2, 3, 4, 5, 6, 7, 9, 10, 11, 12, 13, 14, 15, 16, 17, 18, 19, 20, 21, 22, 23, 24, 25, 26, 27, 28, 29, 30, 31$^{st}$ rows of the generator matrix G of Table 1.

Table 19 below shows another example of the generator matrix with the size of 30×10.

TABLE 19

| i | $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|---|
| 1 | 1 | 0 | 0 | 0 | 0 | 1 | 0 | 0 | 0 | 0 |
| 2 | 0 | 1 | 0 | 0 | 0 | 1 | 1 | 0 | 0 | 0 |
| 3 | 1 | 1 | 0 | 0 | 0 | 1 | 0 | 0 | 0 | 1 |
| 4 | 0 | 0 | 1 | 0 | 0 | 1 | 1 | 0 | 1 | 1 |
| 5 | 1 | 0 | 1 | 0 | 0 | 1 | 0 | 0 | 0 | 1 |
| 6 | 0 | 1 | 1 | 0 | 0 | 1 | 0 | 0 | 1 | 0 |
| 7 | 1 | 1 | 1 | 0 | 0 | 1 | 0 | 1 | 0 | 0 |
| 8 | 0 | 0 | 0 | 1 | 0 | 1 | 0 | 1 | 1 | 0 |
| 9 | 1 | 0 | 0 | 1 | 0 | 1 | 1 | 1 | 0 | 0 |
| 10 | 0 | 1 | 0 | 1 | 0 | 1 | 1 | 0 | 1 | 1 |
| 11 | 1 | 1 | 0 | 1 | 0 | 1 | 0 | 0 | 1 | 1 |
| 12 | 0 | 0 | 1 | 1 | 0 | 1 | 0 | 1 | 1 | 0 |
| 13 | 1 | 0 | 1 | 1 | 0 | 1 | 0 | 1 | 0 | 1 |
| 14 | 0 | 1 | 1 | 1 | 0 | 1 | 1 | 0 | 0 | 1 |
| 15 | 1 | 1 | 1 | 1 | 0 | 1 | 1 | 1 | 1 | 1 |
| 16 | 0 | 0 | 0 | 0 | 1 | 1 | 1 | 0 | 0 | 0 |
| 17 | 1 | 0 | 0 | 0 | 1 | 1 | 1 | 1 | 0 | 0 |
| 18 | 0 | 1 | 0 | 0 | 1 | 1 | 1 | 1 | 0 | 1 |
| 19 | 1 | 1 | 0 | 0 | 1 | 1 | 1 | 0 | 1 | 0 |
| 20 | 0 | 0 | 1 | 0 | 1 | 1 | 0 | 1 | 1 | 1 |
| 21 | 1 | 0 | 1 | 0 | 1 | 1 | 0 | 1 | 0 | 1 |
| 22 | 0 | 1 | 1 | 0 | 1 | 1 | 0 | 0 | 1 | 1 |
| 23 | 1 | 1 | 1 | 0 | 1 | 1 | 0 | 1 | 1 | 1 |
| 25 | 1 | 0 | 0 | 1 | 1 | 1 | 1 | 1 | 0 | 1 |
| 26 | 0 | 1 | 0 | 1 | 1 | 1 | 1 | 0 | 1 | 0 |
| 27 | 1 | 1 | 0 | 1 | 1 | 1 | 1 | 0 | 0 | 1 |
| 28 | 0 | 0 | 1 | 1 | 1 | 1 | 0 | 0 | 1 | 0 |
| 29 | 1 | 0 | 1 | 1 | 1 | 1 | 1 | 1 | 0 | 0 |
| 30 | 0 | 1 | 1 | 1 | 1 | 1 | 1 | 1 | 1 | 0 |
| 31 | 1 | 1 | 1 | 1 | 1 | 1 | 1 | 1 | 1 | 1 |

The generator matrix of Table 19 may be configured by selecting the 1, 2, 3, 4, 5, 6, 7, 8, 9, 10, 11, 12, 13, 14, 15, 16, 17, 18, 19, 20, 21, 22, 23, 25, 26, 27, 28, 29, 30, 31$^{st}$ rows of the generator matrix G of Table 1.

In this manner, the codeword generator 110 receives information bits with a variable length k ($1 \leq k \leq 10$, k is integer) and outputs codewords with a fixed length (e.g., 24 bits) by using generator matrixes.

In the wireless communication system, a base station (BS) and a user equipment (UE) transmit and receive predefined control signals via uplink and downlink for smooth communications therebetween. Data transmission based on institute of electrical and electronics engineers (IEEE) 802.16 standard is performed in different structures and methods according to permutations. A permutation in which some of subchannels are allocated for a data transmission is called a partial usage of subchannels (PUSC), and a permutation in which every subchannel is allocated for a data transmission is called a full usage of subchannels (FUSC). A downlink PUSC is configured with a cluster structure, and an uplink PUSC is configured with a tile structure.

FIG. 2 illustrates the tile structure in the PUSC. In the following description, a two-dimensional resource structure including a plurality of subcarriers contiguous on continued OFDM symbols is defined as a tile. The tile may be used by any other names having the two-dimensional resource structure.

With reference to FIG. 2, Mn,8m+k is the kth transmission symbol index of the mth uplink tile of the nth feedback channel. A tile includes four contiguous subcarriers on three OFDM symbols. Thus, a single tile includes a total of twelve subcarriers. Twelve subcarriers include four perimeter subcarriers 320 positioned at outer edges of the tile and eight data subcarriers 310 positioned at the other remaining portions. Data is transmitted through the eight data subcarriers 310, and the four perimeter subcarriers 320 may be null subcarriers or pilot.

A codeword may be used to transmit control signals such as a channel quality information (CQI), an acknowledgement (ACK)/non-acknowledgement (NACK) signal, a multiple-input multiple-output (MIMO) codebook index, transmit power control (TPC) information, and the like. For example, if the CQI has information bits with a length of 10, the codeword of the CQI may have 24 bits. When the codeword of the CQI has 24 bits, resource required for transmitting single CQI is as follows.

In case of performing quadrature phase shifting keying (QPSK), each subcarrier can carry two-bit information, so a single tile can transmit 16-bit information. Thus, in order to transmit 24-bit codeword, the transmitter 100 based on the QPSK scheme should use two tiles. Or, in case of performing 16-quadrature amplitude modulation (QAM), each subcarrier can carry 4-bit information, so a single tile can transmit 32-bit information. Accordingly, the transmitter 100 based on the 16-QAM scheme can transmit 24-bit codeword by a single tile.

FIG. 3 is a simulation graph showing performance when a method for transmitting a codeword according to an exemplary embodiment of the present invention is used.

Specifically, FIG. 3 shows comparisons between block error rates (BLERs) of the related art (old) and the present invention (proposed) over signal-to-noise ratios (SNRs) when the lengths of information bits are 6, 7, 8, 9, and 10. Here, the code word according to an embodiment of the present invention is generated by puncturing output bits in consideration of references such as a minimum distance or the probability of undetected error, and the like, while the codeword according to the related art is generated by puncturing output bits at every uniform bit index intervals. It is noted that the codeword transmission method according to an embodiment of the present invention shows an improvement of performance within 0.3 dB according to each SNR interval.

The relationship between channel coding and a bit error rate (BER) of each information bit in performing channel coding on the information bits to generate codewords will now be described.

FIG. 4 is a simulation graph showing one example of BERs of information bits. Information bits are channel-coded by using Reed-Muller (RM) codes. The length of the information bits is 6 bits, and a generator matrix has a size of 6×32. In the graph, x axis is an energy bit-to-noise density ratio ($E_b/N_o$) and y axis is an error rate. The unit of the $E_b/N_o$ is decibel (dB).

With reference to FIG. 4, each bit rate of the information bits has the almost same BER.

Information transmitted in the wireless communication system includes data, control information, or the like. In general, data includes scores of bits to thousands of bits, and control information carries relatively short information within scores of bits. The bits of the control information may carry irrelevant information or several bits may gather to represent a single value.

Table 20 below shows the cases that each bit information formed by gathered four bits indicates a single value.

TABLE 20

| Bit sequence | value |
|---|---|
| 0000 | 0 |
| 0001 | 1 |
| 0010 | 2 |
| 0011 | 3 |
| 0100 | 4 |
| 0101 | 5 |
| 0110 | 6 |
| 0111 | 7 |
| 1000 | 8 |
| 1001 | 9 |
| 1010 | 10 |
| 1011 | 11 |
| 1100 | 12 |
| 1101 | 13 |
| 1110 | 14 |
| 1111 | 15 |

With reference to Table 20, if there occurs an error in the first bit (i.e., single bit), the least significant bit (LSB), in the four-bit information, its error value is 1. If there occurs an error in the fourth bit (i.e., single bit), the most significant bit (MSB), in the four-bit information, its error value is 8.

FIG. 5 illustrates error values when each information bit has an error.

With reference to FIG. 5, the length of the information bits is n bits (n is a natural number). The nth bit is the MSB, and the first bit is the LSB. When there occurs an error in the kth bit (i.e., single bit), its error value is $2^{k-1}$ (k is a natural number of n or smaller).

In case of the information bits gathered to indicate a single value, an error value with a value intended to be originally transmitted may change depending on the position of a bit error. This tendency appears severely at information bits that indicate a single value by more number of bits. In this case, by making a bit close to the MSB in the information bits robust, a BER of the bit close to the MSB can be lowered. By doing that, the degree of an error that may be possibly generated in the process of transferring the information bits can be reduced and the accuracy of reception of the information bits can be increased, resulting in the increase in the reliability of wireless communication.

Thus, in transmitting information bits in the wireless communication system, a method for transmitting a portion of the information bits by making the portion robust compared with other portions of the information bits is required. Hereinafter, an unequal error protected (UEP) channel coding method in which error generation rate differs depending on bit positions of the information bits will now be described.

A UEP generator matrix for making the bit at the side of the MSB robust may be generated under the following criteria.

(1) The UEP generator matrix includes one row having only 1. Namely, when the UEP generator matrix is made up of a plurality of row vectors, elements of one of the plurality of row vectors are all 1.

(2) The other remaining rows of the UEP generator matrix, excluding the row of (1), are arranged such that they have a similar weight. Here, the weight is the number of 1 among the elements constituting the rows.

(3) Each row of (2) includes 0 and 1 arranged in the cycle of a divisor of the number of columns of the UEP generator matrix. For example, if the number of columns of the UEP generator matrix is 24, the pattern of 0 and 1 of the rows may be arranged in the cycle of 1, 2, 3, 4, 6, 8, 12, or 24.

(4) The number of columns repeated in the UEP generator matrix is minimized.

A 6×24 UEP generator matrix will now be described. The length of information bits inputted to the 6×24 UEP generator matrix is 6 bits, and the length of a codeword outputted after performing channel coding on the information bits is 24 bits.

Table 21 below shows an example of the 6×24 UEP operating matrix employing the above-described rules.

TABLE 21

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | Weight |
|---|---|---|---|---|---|---|---|---|---|---|---|---|---|---|---|---|---|---|---|---|---|---|---|---|---|
| Bit 0 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 12 |
| Bit 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 12 |
| Bit 2 | 0 | 0 | 0 | 1 | 1 | 1 | 0 | 0 | 0 | 1 | 1 | 1 | 0 | 0 | 0 | 1 | 1 | 1 | 0 | 0 | 0 | 1 | 1 | 1 | 12 |
| Bit 3 | 0 | 0 | 0 | 0 | 0 | 0 | 1 | 1 | 1 | 1 | 1 | 1 | 0 | 0 | 0 | 0 | 0 | 0 | 1 | 1 | 1 | 1 | 1 | 1 | 12 |
| Bit 4 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 24 |
| Bit 5 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 12 |

In Table 21, a fifth row of the UEP generator matrix for the fourth bit of the information bits have only 1. This satisfies the rule (1). The weights of the rows of the UEP generator matrix, excluding the fifth row, are all 12. This satisfies the rule (2). A first row (Bit 0) of the UEP generator matrix has a pattern of 01 repeated in the cycle of 2. A second row (Bit 1) of the UEP generator matrix has a pattern of 0011 repeated in the cycle of 4. A third row (Bit 2) of the UEP generator matrix has a pattern of 000111 in the cycle of 6. A fourth row (Bit 3) of the UEP generator matrix has a pattern of 000000111111 repeated in the cycle of 12. A sixth row (Bit 5) of the UEP generator matrix has a pattern of 000000000000111111111111 in the cycle of 24. This satisfies the rule (3). None of the columns is repeated in the UEP generator matrix. This satisfies the rule (4).

The UEP generator matrix as shown in the above Table 21 may be generated from Reed-Muller (RM) codes. For example, The UEP generator matrix as shown in Table 21 may be generated through permutation and puncturing from a 6×32 matrix generated from the RM codes.

Table 22 below shows the 6×32 matrix generated from the RM codes.

TABLE 22

|  | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| Bit 0 | 0 | 1 | 0 | 1 | 0 | 1 | 0 | 1 | 0 | 1 | 0 | 1 | 0 | 1 | 0 | 1 | 0 |
| Bit 1 | 0 | 0 | 1 | 1 | 0 | 0 | 1 | 1 | 0 | 0 | 1 | 1 | 0 | 0 | 1 | 1 | 0 |
| Bit 2 | 0 | 0 | 0 | 0 | 1 | 1 | 1 | 1 | 0 | 0 | 0 | 0 | 1 | 1 | 1 | 1 | 0 |
| Bit 3 | 0 | 0 | 0 | 0 | 0 | 0 | 0 | 0 | 1 | 1 | 1 | 1 | 1 | 1 | 1 | 1 | 0 |
| Bit 4 | 0 | 0 | 0 | 0 | 0 | 0 | 0 | 0 | 0 | 0 | 0 | 0 | 0 | 0 | 0 | 0 | 1 |
| Bit 5 | 1 | 1 | 1 | 1 | 1 | 1 | 1 | 1 | 1 | 1 | 1 | 1 | 1 | 1 | 1 | 1 | 1 |

|  | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|
| Bit 0 | 1 | 0 | 1 | 0 | 1 | 0 | 1 | 0 | 1 | 0 | 1 | 0 | 1 | 0 | 1 |
| Bit 1 | 0 | 1 | 1 | 0 | 0 | 1 | 1 | 0 | 0 | 1 | 1 | 0 | 0 | 1 | 1 |
| Bit 2 | 0 | 0 | 0 | 1 | 1 | 1 | 1 | 0 | 0 | 0 | 0 | 1 | 1 | 1 | 1 |
| Bit 3 | 0 | 0 | 0 | 0 | 0 | 0 | 0 | 1 | 1 | 1 | 1 | 1 | 1 | 1 | 1 |
| Bit 4 | 1 | 1 | 1 | 1 | 1 | 1 | 1 | 1 | 1 | 1 | 1 | 1 | 1 | 1 | 1 |
| Bit 5 | 1 | 1 | 1 | 1 | 1 | 1 | 1 | 1 | 1 | 1 | 1 | 1 | 1 | 1 | 1 |

In Table 22, the 3, 6, 9, 12, 19, 22, 25, $28^{th}$ rows of the matrix are punctured. If fifth and sixth rows (Bit 4 and Bit 5) are interchanged to be arranged in the order of the 0, 1, 2, 7, 4, 5, 10, 11, 8, 13, 14, 15, 16, 17, 18, 23, 20, 21, 26, 27, 24, 29, 30, $31^{st}$ rows, the 6×24 UEP generator matrix of Table 21 may be generated.

Table 23 below shows another example of the 6×24 UEP generator matrix.

TABLE 23

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | Weight |
|---|---|---|---|---|---|---|---|---|---|---|---|---|---|---|---|---|---|---|---|---|---|---|---|---|
| 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 12 |
| 0 | 1 | 1 | 1 | 0 | 0 | 0 | 1 | 1 | 1 | 0 | 0 | 0 | 1 | 1 | 1 | 0 | 0 | 0 | 1 | 1 | 1 | 0 | 0 | 12 |
| 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 12 |
| 0 | 0 | 0 | 0 | 0 | 1 | 1 | 1 | 1 | 1 | 1 | 0 | 0 | 0 | 0 | 0 | 1 | 1 | 1 | 1 | 1 | 1 | 1 | 0 | 12 |
| 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 12 |
| 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 24 |

In Table 23, a sixth row of the UEP generator matrix has only 1. This satisfies the rule (1). The weights of the rows of the UEP generator matrix, excluding the sixth row, are all 12. This satisfies the rule (2). A first row of the UEP generator matrix has a pattern of 01 repeated in the cycle of 2. A second row of the UEP generator matrix has a pattern of 011100 repeated in the cycle of 6. A third row of the UEP generator matrix has a pattern of 1100 in the cycle of 4. A fourth row of the UEP generator matrix has a pattern of 000001111110 repeated in the cycle of 12. A fifth row of the UEP generator matrix has a pattern of 000000000000111111111111 in the cycle of 24. This satisfies the rule (3). The number of repeated columns in the UEP generator matrix is minimized. This satisfies the rule (4).

When the UEP generator matrix of Table 21 is G, it can be represented by Equation 7 shown below:

MathFigure 7

$$G = \begin{bmatrix} v_1 = (010101010101010101010101) \\ v_2 = (001100110011001100110011) \\ v_3 = (000111000111000111000111) \\ v_4 = (000000111111000000111111) \\ v_5 = (111111111111111111111111) \\ v_6 = (000000000000111111111111) \end{bmatrix}$$ [Math. 7]

wherein $v_1, v_2, v_3, v_4, v_5, v_6$ are basis sequences or row vectors.

The information bits m with the length of 6 may be represented by Equation 8 shown below:

MathFigure 8

$$m = [m_1, m_2, m_3, m_4, m_5, m_0] = [M_1 | m_0]$$ [Math.8]

wherein $m_6$ is the MSB and $m_1$ is the LSB.

Accordingly, when a codeword generated by using the information bits m and the UEP generator matrix G, it can be represented by Equation 9 shown below:

MathFigure 9

$$b = m_1 v_1 + m_2 v_2 + m_3 v_3 + m_4 v_4 + m_5 v_5 + m_6 v_6$$ [Math.9]

FIG. 6 is a simulation graph showing another example of a bit error rate of each information bit. The information bits are channel-coded by using the UEP generator matrix G as represented by Equation 7. The length of the information bits is 6, and the size of the UEP generator matrix G is 6×24. In the graph, x axis is an energy bit-to-noise density ratio ($E_b/N_o$) and y axis is an error rate. The unit of the $E_b/N_o$ is decibel (dB). It is assumed that channel noise is additive white Gaussian noise (AWGN).

With reference to FIG. 6, fifth and fourth bits (Bit5 and Bit4), the MSBs of the information bits, have a different bit error rate (BER) from that of the other remaining bits (Bit0, Bit1, Bit2, Bit3). The other remaining bits (Bit0, Bit1, Bit2, Bit3) of the information bits have the substantially same BER. The fifth bit (Bit5), the MSB, have a performance gain of about 0.5 dB at a 1 percent error rate ($10^{-2}$) compared with the other remaining bits (Bit0, Bit1, Bit2, Bit3). The fourth bit (Bit4) has a performance gain of about 0.25 dB compared with the other remaining bits (Bit0, Bit1, Bit2, Bit3).

When the MSB of the information bits has an error, a 50 percent error of the value indicated by the overall errors is generated as an error value. When two upper bits of the information bits have an error, a maximum 75 percent error of the value indicated by the overall bits is generated as an error value. Thus, if no error occurs in the two upper bits of the information bits, although an error occurs in the other remaining bits, the error comes within a 25 percent of the maximum value of a value desired to be expressed.

In this manner, through the UEP generator matrix making the bits close to the MSB in the information bits robust, the BER of the bits close to the MSB can be lowered. Accordingly, the degree of an error that may be generated during the process of transferring the information bits can be reduced and the accuracy of receiving the information bits can be increased. Resultantly, the reliability of wireless communication can be enhanced.

A masking sequence will now be described. The masking sequence is a sequence portion added to a generator matrix in order to increase the length of information bits with respect to a block code.

(32, 6) RM code may be defined through the generator matrix G and the message vector m.

The generator matrix G can be represented by Equation 10 shown below:

MathFigure 10

$$\begin{bmatrix} v_1 = (01010101010101010101010101010101) \\ v_2 = (00110011001100110011001100110011) \\ v_3 = (00001111000011110000111100001111) \\ v_4 = (00000000111111110000000011111111) \\ v_5 = (00000000000000001111111111111111) \end{bmatrix} = G_1$$ [Math. 10]

$$[1 = (11111111111111111111111111111111)] = G_0$$

The generator matrix G may include $G_1$ and $G_0$.

The message vector m can be represented by Equation 11 shown below:

MathFigure 11

$$m = |m_1, m_2, m_3, m_4, m_5, m_0| = |m_1|m_0|$$ [Math.11]

A codeword b is obtained by multiplying the message vector m to the generator matrix G, and it can be represented by Equation 12 shown below:

MathFigure 12

$$b = [m_1 | m_0] \begin{bmatrix} G_1 \\ G_0 \end{bmatrix}$$ [Math. 12]
$$= m_1 v_1 + m_2 v_2 + m_3 v_3 + m_4 v_4 + m_5 v_5 + m_0 1$$

In order to increase the number of information bits, the masking sequence may be added to the generator matrix. The length of the masking sequence is the same as the number of columns of the generator matrix. In this case, however, the columns of the generator matrix may be removed to adjust the length of the codeword. The number of masking sequences is the same as the number of information bits exceeding a basic information length. For example, the basic information length of (32, 6) RM code is 6 bits. If the number of information bits to be supported is 8, the number of masking sequences is 2. If the number of information bits is 6 or smaller, the number of masking sequence is 0.

The masking sequence may be generated according to the following method.

(1) Generating of a masking sequence that maximizes a minimum distance of the overall codeword is a ground rule.

(2) When a basic block code needs puncturing, generation of the masking sequence is performed based on a punctured generator matrix after a puncturing process is finished.

(3) If there are a plurality of lengths of information bits desired to be increased, masking sequences are generated in a sequential order. In this case, a next masking is generated by measuring a minimum distance by including a previous masking sequence.

A set of masking sequences is generated by inspecting combinations available starting from a theoretically maximum value of a minimum distance that a codeword length desired to be generated may have.

If the theoretically maximum value of a minimum distance does not exist in the code of the information bits desired to be increased, a masking sequence is generated by using the next maximum value.

If there are a plurality of sequences having the same maximum value of a minimum distance, a sequence having the best decoding performance is selected.

Table 24 below shows an example of a generator matrix that generates 30 codewords and supports information bits with lengths of 5 to 12.

TABLE 24

| i | $v_1$ | $v_2$ | $v_3$ | $v_4$ | $v_5$ | $v_6$ | $v_7$ | $v_8$ | $v_9$ | $v_{10}$ | $v_{11}$ | $v_{12}$ |
|---|---|---|---|---|---|---|---|---|---|---|---|---|
| 1 | 1 | 0 | 0 | 0 | 0 | 1 | 0 | 0 | 0 | 0 | 0 | 1 |
| 2 | 0 | 1 | 0 | 0 | 0 | 1 | 1 | 0 | 0 | 0 | 0 | 0 |
| 3 | 1 | 1 | 0 | 0 | 0 | 1 | 0 | 0 | 0 | 1 | 1 | 0 |
| 4 | 0 | 0 | 1 | 0 | 0 | 1 | 1 | 0 | 1 | 1 | 1 | 0 |
| 5 | 1 | 0 | 1 | 0 | 0 | 1 | 0 | 0 | 0 | 1 | 0 | 1 |
| 6 | 0 | 1 | 1 | 0 | 0 | 1 | 0 | 0 | 1 | 0 | 1 | 1 |
| 7 | 1 | 1 | 1 | 0 | 0 | 1 | 0 | 1 | 0 | 0 | 0 | 1 |
| 8 | 0 | 0 | 0 | 1 | 0 | 1 | 0 | 1 | 1 | 0 | 0 | 0 |
| 9 | 1 | 0 | 0 | 1 | 0 | 1 | 1 | 1 | 1 | 0 | 0 | 0 |
| 10 | 0 | 1 | 0 | 1 | 0 | 1 | 1 | 0 | 1 | 1 | 0 | 0 |
| 11 | 1 | 1 | 0 | 1 | 0 | 1 | 0 | 0 | 1 | 1 | 1 | 0 |
| 12 | 0 | 0 | 1 | 1 | 0 | 1 | 0 | 1 | 1 | 0 | 0 | 1 |
| 13 | 1 | 0 | 1 | 1 | 0 | 1 | 0 | 1 | 0 | 1 | 1 | 1 |
| 14 | 0 | 1 | 1 | 1 | 0 | 1 | 1 | 0 | 0 | 1 | 1 | 1 |
| 15 | 1 | 1 | 1 | 1 | 0 | 1 | 1 | 1 | 1 | 1 | 1 | 0 |
| 17 | 1 | 0 | 0 | 0 | 1 | 1 | 1 | 1 | 0 | 0 | 1 | 0 |
| 18 | 0 | 1 | 0 | 0 | 1 | 1 | 1 | 1 | 0 | 1 | 0 | 1 |
| 19 | 1 | 1 | 0 | 0 | 1 | 1 | 1 | 0 | 1 | 0 | 1 | 1 |
| 20 | 0 | 0 | 1 | 0 | 1 | 1 | 0 | 1 | 1 | 1 | 1 | 1 |
| 21 | 1 | 0 | 1 | 0 | 1 | 1 | 0 | 1 | 0 | 1 | 1 | 1 |
| 22 | 0 | 1 | 1 | 0 | 1 | 1 | 0 | 0 | 1 | 1 | 0 | 0 |
| 23 | 1 | 1 | 1 | 0 | 1 | 1 | 0 | 1 | 1 | 1 | 1 | 1 |
| 24 | 0 | 0 | 0 | 1 | 1 | 1 | 0 | 1 | 0 | 0 | 0 | 1 |
| 25 | 1 | 0 | 0 | 1 | 1 | 1 | 1 | 1 | 0 | 1 | 0 | 1 |
| 26 | 0 | 1 | 0 | 1 | 1 | 1 | 1 | 0 | 1 | 0 | 0 | 1 |
| 27 | 1 | 1 | 0 | 1 | 1 | 1 | 1 | 0 | 0 | 1 | 0 | 0 |
| 28 | 0 | 0 | 1 | 1 | 1 | 1 | 0 | 0 | 1 | 0 | 0 | 1 |
| 29 | 1 | 0 | 1 | 1 | 1 | 1 | 1 | 1 | 0 | 0 | 1 | 0 |
| 30 | 0 | 1 | 1 | 1 | 1 | 1 | 1 | 1 | 0 | 0 | 1 | 1 |
| 31 | 1 | 1 | 1 | 1 | 1 | 1 | 1 | 1 | 1 | 1 | 1 | 1 |

The generator matrix of Table 24 can be generated from the matrix of the (32, 6) RM code of Table 22. First, the 0 and $16^{th}$ row of the matrix are punctured. Namely, the 1, 2, 3, 4, 5, 6, 7, 8, 9, 10, 11, 12, 13, 14, 15, 17, 18, 19, 20, 21, 22, 23, 24, 25, 26, 27, 28, 29, 30, $31^{st}$ rows are selected from the matrix. $v_7$ to $v_{12}$ sequences are masking sequences.

Equation 13 below shows the masking sequences (G2).

MathFigure 13

$$\begin{bmatrix} v_{5+1} = (0101010101 \ldots 010101010101) \\ v_{5+2} = (0011001100 \ldots 001100110011) \\ v_{5+3} = (0000111100 \ldots 111100001111) \\ \vdots \\ v_{5+i} = (0011001100 \ldots 010101010111) \end{bmatrix} = G_2$$ [Math. 13]

The message vector m with an increased length may be represented by Equation 14 shown below:

MathFigure 14

$$m = [m_1, m_2, m_3, m_4, m_5, m_0, m_{5+1}, m_{5+2}, \ldots, m_{5+i}] = [m_1 | m_0 | m_2]$$ [Math.14]

The codeword b is obtained by multiplying the message vector m to the generator matrix G including $G_1$, $G_0$ and $G_2$ and it can be represented by Equation 15 shown below:

MathFigure 15

$$b = [m_1 | m_0 | m_2] \begin{bmatrix} G_1 \\ G_0 \\ G_2 \end{bmatrix}$$ [Math. 15]

$$= m_1 v_1 + m_2 v_2 + m_3 v_3 + m_4 v_4 + m_5 v_5 + m_0 1 + m_{5+1} v_{5+1} + m_{5+2} v_{5+2} + \ldots + m_{5+i} v_{5+i}$$

FIG. 7 is a simulation graph showing BERs in case of channel coding by using masking codes. In the graph, x axis is an energy bit-to-noise density ratio ($E_b/N_o$) and y axis is a BER. The unit of the $E_b/N_o$ is decibel (dB). It is assumed that channel noise is additive white Gaussian noise (AWGN).

In case of the existing (32, 6) RM code, it supports a code rate at which the length of the information bits is fixed as 6 or smaller and the length of a codeword is fixed as 32 bits and a fixed information bit length. When channel coding is performed by using the puncturing pattern and the masking codes, it is confirmed that a similar performance to that of the related art is obtained in the view point of the $E_b/N_o$.

A method of designing a generator matrix that can support information bits and codewords of various lengths.

Figure 8:
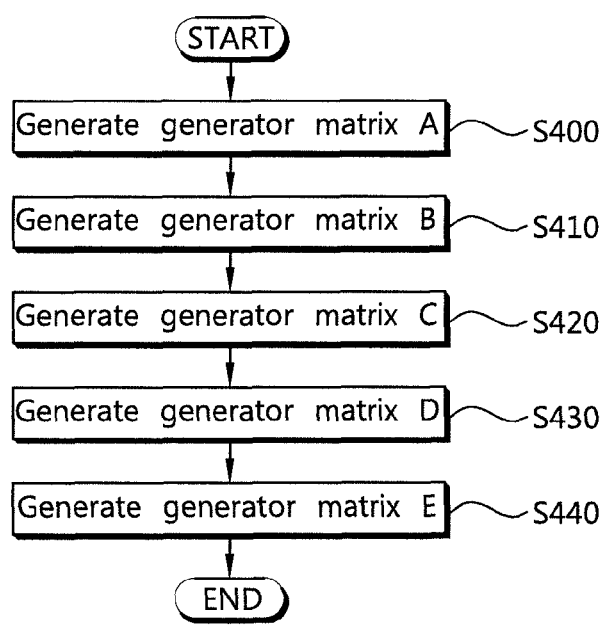
FIG. 8 is a flow chart illustrating a method of designing a generator matrix according to an exemplary embodiment of the present invention.

FIG. 8 is a flow chart illustrating a method of designing a generator matrix according to an exemplary embodiment of the present invention, and FIG. 9 illustrates a generator matrix designed according to a proposed method. Following description will be made with reference to FIGS. 8 and 9.

In step S400, a basic matrix 500 based on a block code larger than a minimum codeword desired to be supported but smaller than the length of a maximum codeword is generated. The basic matrix is generated based on such block code as the RM code generated in the form of exponential multiplication of 2, so it is possible to design a generator matrix with good error correction capability within a relatively short time.

In step S410, an n×i generator matrix A 510, a set of rows having optimum performance, when the length of the codeword in the basic matrix is n is generated. In this case, after the basic matrix is permutated, the first n number of rows may be selected to generate the generator matrix A 510.

In step S420, the other remaining portion, excluding the generator matrix A 510, is generated as a m×i generator matrix B 520. The generator matrix B 520 is added to below the generator matrix A 510, and the generator matrixes A 510 and B 520 are combined to form a (m+n)×i generator matrix.

In step S430, at least one row is selected from the generator matrix A (510) to generate a 1×i generator matrix C 530 (1<n). The generator matrix C (530) is added to below the generator matrix B 520, and the generator matrixes 510, 520, and 530 are combined to form a (1+m+n)×i, namely, g×i, generator matrix. Through this process, the codeword length can be increased.

If the length of information bits desired to be support is longer than that of the block code (k>l), the generator matrix needs to be expanded. In step S440, an n×j (j=k−i) generator matrix D 540 is generated in consideration of the generator matrix A 510. The generator matrix D 540 is added to the right side of the generator matrix 510. When the generator matrix A 510 is considered, a minimum length between codewords, a probability of undetected error of each bit of a codeword, or the like, may be considered. Rather than directly generating a g×j generator matrix, the overall codeword length, the n×j generator matrix D 540 is first generated and then a h×j generator matrix 550 (to be described) is generated to shorten time for designing the overall generator matrix.

In step S450, the h×j generator matrix E 550 is generated in consideration of the generator matrixes A 510, B 520, C 530, and D 540, and the generator E 550 should be different from the matrix D 540. The generator matrix E 550 is added to below the generator matrix D 540. In this case, when the generator matrixes A 510, B 520, C 530, and D 540 are considered, a minimum length between codewords, a probability of undetected error of each bit of a codeword, or the like, may be considered. Because the generator matrix E 550 having a different form from that of the generator matrix D 540, although the codeword length increases, a new type of codeword is generated, rather than a simple repeated one, so a coding gain can be obtained, and because the generator matrixes B 520 and C 530 are reused, time for designing the generator matrix can be shortened.

The generator matrixes A 510, B 520, C 530, D 540, and E 550 may be divided as necessary, and if the length of information bits becomes larger than k, a portion of the generator matrixes may be repeatedly used as necessary. For example, in case of designing a 48×12 generator matrix, if the length of information bits is 12 bits or smaller, a 48-bit codeword is generated to be used by using the entire 48×12 generator matrix, and if the length of information bits is 13 bits or larger, a 24-bit codeword is generated by using a 2412 generator matrix, a portion of the 48×12 generator matrix, and transmitted in a concatenation manner by using the remaining 24×12 generator matrix.

In case of designing a 60×12 generator matrix, if the length of information bits is 12 bits or smaller, a 60-bit codeword may be generated to be used by using the entire generator matrix of 60×12 size, and if the length of information bits is 13 bits or larger, a 30-bit codeword may be generated by using a matrix having a size of 30×12, a portion of the generator matrix having the size of 60×12, and transmitted in a concatenation manner by using the remaining 30×12 generator matrix.

Table 25 below shows the 48×12 generator matrix designed according to a proposed method.

TABLE 25

| | v1 | v2 | v3 | v4 | v5 | v6 | v7 | v8 | v9 | v10 | v11 | v12 |
|---|---|---|---|---|---|---|---|---|---|---|---|---|
| 1 | 0 | 0 | 0 | 0 | 0 | 1 | 0 | 0 | 0 | 0 | 1 | 0 |
| 2 | 1 | 0 | 0 | 0 | 0 | 1 | 0 | 0 | 0 | 0 | 1 | 1 |
| 3 | 0 | 1 | 0 | 0 | 0 | 1 | 1 | 0 | 0 | 0 | 0 | 0 |
| 4 | 1 | 1 | 0 | 0 | 0 | 1 | 0 | 0 | 0 | 1 | 1 | 1 |
| 5 | 0 | 0 | 1 | 0 | 0 | 1 | 1 | 0 | 1 | 1 | 0 | 0 |
| 6 | 1 | 0 | 1 | 0 | 0 | 1 | 0 | 0 | 0 | 1 | 1 | 0 |
| 7 | 0 | 1 | 1 | 0 | 0 | 1 | 0 | 0 | 1 | 0 | 1 | 1 |
| 8 | 0 | 0 | 0 | 1 | 0 | 1 | 0 | 1 | 1 | 0 | 0 | 0 |
| 9 | 1 | 0 | 0 | 1 | 0 | 1 | 1 | 1 | 1 | 0 | 0 | 1 |
| 10 | 0 | 1 | 1 | 1 | 0 | 1 | 1 | 0 | 0 | 1 | 1 | 0 |
| 11 | 0 | 0 | 0 | 0 | 1 | 1 | 1 | 0 | 0 | 0 | 0 | 1 |
| 12 | 0 | 1 | 0 | 0 | 1 | 1 | 1 | 1 | 0 | 1 | 1 | 1 |
| 13 | 1 | 1 | 0 | 0 | 1 | 1 | 1 | 0 | 1 | 0 | 1 | 0 |
| 14 | 0 | 1 | 0 | 1 | 0 | 1 | 0 | 1 | 1 | 1 | 0 | 0 |
| 15 | 1 | 0 | 1 | 0 | 1 | 1 | 0 | 1 | 0 | 1 | 0 | 1 |
| 16 | 0 | 1 | 1 | 0 | 1 | 1 | 0 | 0 | 1 | 0 | 1 | 0 |
| 17 | 1 | 1 | 1 | 0 | 1 | 1 | 0 | 1 | 1 | 1 | 0 | 0 |
| 18 | 0 | 0 | 0 | 1 | 1 | 1 | 0 | 1 | 0 | 0 | 0 | 1 |
| 19 | 0 | 1 | 0 | 1 | 1 | 1 | 1 | 0 | 1 | 0 | 1 | 1 |
| 20 | 1 | 1 | 0 | 1 | 1 | 1 | 1 | 0 | 0 | 1 | 0 | 0 |
| 21 | 0 | 0 | 1 | 1 | 1 | 1 | 0 | 0 | 1 | 0 | 1 | 0 |
| 22 | 1 | 0 | 1 | 1 | 1 | 1 | 1 | 0 | 0 | 0 | 0 | 1 |
| 23 | 0 | 1 | 1 | 1 | 1 | 1 | 1 | 1 | 0 | 0 | 0 | 1 |
| 24 | 1 | 1 | 1 | 1 | 1 | 1 | 1 | 1 | 1 | 1 | 1 | 0 |
| 25 | 1 | 1 | 1 | 0 | 0 | 1 | 0 | 1 | 0 | 0 | 1 | 1 |

TABLE 25-continued

| | v1 | v2 | v3 | v4 | v5 | v6 | v7 | v8 | v9 | v10 | v11 | v12 |
|---|---|---|---|---|---|---|---|---|---|---|---|---|
| 26 | 0 | 1 | 0 | 1 | 0 | 1 | 1 | 0 | 1 | 1 | 1 | 0 |
| 27 | 1 | 1 | 0 | 1 | 0 | 1 | 0 | 0 | 1 | 1 | 1 | 1 |
| 28 | 0 | 0 | 1 | 1 | 0 | 1 | 0 | 1 | 1 | 0 | 1 | 1 |
| 29 | 1 | 0 | 1 | 1 | 0 | 1 | 0 | 1 | 0 | 1 | 0 | 1 |
| 30 | 1 | 1 | 1 | 1 | 0 | 1 | 1 | 1 | 1 | 1 | 1 | 1 |
| 31 | 1 | 0 | 0 | 0 | 1 | 1 | 1 | 1 | 0 | 0 | 0 | 0 |
| 32 | 1 | 0 | 0 | 1 | 1 | 1 | 1 | 1 | 0 | 1 | 0 | 1 |
| 33 | 0 | 0 | 0 | 0 | 1 | 1 | 0 | 1 | 0 | 1 | 0 | 1 |
| 34 | 1 | 0 | 0 | 0 | 0 | 1 | 0 | 1 | 1 | 1 | 0 | 1 |
| 35 | 0 | 1 | 0 | 0 | 0 | 1 | 0 | 0 | 0 | 0 | 0 | 1 |
| 36 | 1 | 1 | 0 | 0 | 0 | 1 | 1 | 0 | 1 | 1 | 1 | 1 |
| 37 | 0 | 0 | 1 | 0 | 0 | 1 | 0 | 0 | 1 | 0 | 1 | 1 |
| 38 | 1 | 0 | 1 | 0 | 0 | 1 | 1 | 1 | 1 | 1 | 1 | 1 |
| 39 | 0 | 1 | 1 | 0 | 0 | 1 | 1 | 1 | 1 | 0 | 0 | 0 |
| 40 | 0 | 0 | 0 | 0 | 1 | 0 | 0 | 0 | 1 | 0 | 0 | 0 |
| 41 | 1 | 0 | 0 | 1 | 0 | 1 | 0 | 1 | 1 | 1 | 0 | 0 |
| 42 | 0 | 1 | 1 | 1 | 0 | 1 | 0 | 1 | 1 | 0 | 0 | 1 |
| 43 | 0 | 0 | 0 | 0 | 1 | 1 | 0 | 1 | 0 | 1 | 0 | 1 |
| 44 | 0 | 1 | 0 | 0 | 1 | 1 | 0 | 1 | 1 | 0 | 1 | 1 |
| 45 | 1 | 1 | 0 | 1 | 1 | 1 | 0 | 0 | 1 | 0 | 0 | 1 |
| 46 | 0 | 0 | 1 | 0 | 1 | 1 | 0 | 0 | 0 | 1 | 1 | 1 |
| 47 | 1 | 0 | 1 | 0 | 1 | 1 | 0 | 1 | 1 | 0 | 1 | 1 |
| 48 | 0 | 1 | 1 | 0 | 1 | 1 | 0 | 0 | 0 | 0 | 1 | 0 |

$v_1, v_2, \ldots, v_{12}$ are basis sequences (or vectors) included in the generator matrix G. The number ($v_k$) of the columns is indexes of input information bits, and the number (i) of the rows is bit indexes of codewords generated by the generator matrix G. The length of information bits is variable. When information bits with a length of 7 are input, the generator matrix G may have a size of 48×7. In this case, the generator matrix G includes only first to seventh columns, excluding the last five columns (i.e., the eighth to $12^{th}$ columns). In addition, if information bits with a length of 9 are input, the generator matrix G may have a size of 48×9. In this manner, the size of the generator matrix G may be expanded or reduced according to the length of the information bits.

The generator matrix is generated based on the (32, 6) RM code. First, a basic matrix is generated based on the (32, 6) RM code and then permutated to generate a 24×6 generator matrix A and a remaining portion 8×6 generator matrix B. In addition, 16 rows of the generator matrix A are selected to generate a generator matrix C. A 24×6 generator matrix D in which a minimum distance between codewords is maximized is generated in consideration of the generator matrix A, and a 24×6 generator matrix E in which a minimum distance between codewords is maximized is generated in consideration of the generator matrixes B and C.

Table 26 below shows an example of a 60×12 generator matrix designed according to a proposed method.

TABLE 26

| | v1 | v2 | v3 | v4 | v5 | v6 | v7 | v8 | v9 | v10 | v11 | v12 |
|---|---|---|---|---|---|---|---|---|---|---|---|---|
| 1 | 0 | 0 | 0 | 0 | 0 | 1 | 0 | 0 | 0 | 0 | 1 | 0 |
| 2 | 1 | 0 | 0 | 0 | 0 | 1 | 0 | 0 | 0 | 0 | 1 | 1 |
| 3 | 0 | 1 | 0 | 0 | 0 | 1 | 1 | 0 | 0 | 0 | 0 | 0 |
| 4 | 1 | 1 | 0 | 0 | 0 | 1 | 0 | 0 | 0 | 1 | 1 | 1 |
| 5 | 0 | 0 | 1 | 0 | 0 | 1 | 1 | 0 | 1 | 1 | 0 | 0 |
| 6 | 1 | 0 | 1 | 0 | 0 | 1 | 0 | 0 | 0 | 1 | 1 | 0 |
| 7 | 0 | 1 | 1 | 0 | 0 | 1 | 0 | 0 | 1 | 0 | 1 | 1 |
| 8 | 0 | 0 | 0 | 1 | 0 | 1 | 0 | 1 | 1 | 0 | 0 | 0 |
| 9 | 1 | 0 | 0 | 1 | 0 | 1 | 1 | 1 | 1 | 0 | 0 | 1 |
| 10 | 0 | 1 | 1 | 1 | 0 | 1 | 1 | 0 | 0 | 1 | 1 | 0 |
| 11 | 0 | 0 | 0 | 0 | 1 | 1 | 1 | 0 | 0 | 0 | 0 | 1 |
| 12 | 0 | 1 | 0 | 0 | 1 | 1 | 1 | 1 | 0 | 1 | 1 | 1 |
| 13 | 1 | 1 | 0 | 0 | 1 | 1 | 1 | 0 | 1 | 0 | 1 | 0 |
| 14 | 0 | 0 | 1 | 0 | 1 | 1 | 0 | 0 | 1 | 1 | 0 | 0 |
| 15 | 1 | 0 | 1 | 0 | 1 | 1 | 0 | 1 | 0 | 1 | 0 | 1 |

TABLE 26-continued

| | v1 | v2 | v3 | v4 | v5 | v6 | v7 | v8 | v9 | v10 | v11 | v12 |
|---|---|---|---|---|---|---|---|---|---|---|---|---|
| 16 | 0 | 1 | 1 | 0 | 1 | 1 | 0 | 0 | 1 | 1 | 0 | 1 |
| 17 | 1 | 1 | 1 | 0 | 1 | 1 | 0 | 1 | 1 | 1 | 0 | 0 |
| 18 | 0 | 0 | 0 | 1 | 1 | 1 | 0 | 1 | 0 | 0 | 0 | 1 |
| 19 | 0 | 1 | 0 | 1 | 1 | 1 | 1 | 0 | 1 | 0 | 1 | 1 |
| 20 | 1 | 1 | 0 | 1 | 1 | 1 | 1 | 0 | 0 | 1 | 1 | 0 |
| 21 | 0 | 0 | 1 | 1 | 1 | 1 | 0 | 0 | 1 | 0 | 1 | 0 |
| 22 | 1 | 0 | 1 | 1 | 1 | 1 | 1 | 0 | 0 | 0 | 0 | 1 |
| 23 | 0 | 1 | 1 | 1 | 1 | 1 | 1 | 1 | 0 | 0 | 0 | 1 |
| 24 | 1 | 1 | 1 | 1 | 1 | 1 | 1 | 1 | 1 | 1 | 1 | 0 |
| 25 | 1 | 1 | 1 | 0 | 0 | 1 | 0 | 1 | 0 | 0 | 1 | 1 |
| 26 | 0 | 1 | 0 | 1 | 0 | 1 | 1 | 0 | 1 | 1 | 1 | 0 |
| 27 | 1 | 1 | 0 | 1 | 0 | 1 | 0 | 0 | 1 | 1 | 1 | 1 |
| 28 | 0 | 0 | 1 | 1 | 0 | 1 | 0 | 1 | 1 | 0 | 1 | 1 |
| 29 | 1 | 0 | 1 | 1 | 0 | 1 | 0 | 1 | 0 | 1 | 0 | 1 |
| 30 | 1 | 1 | 1 | 1 | 0 | 1 | 1 | 1 | 1 | 1 | 1 | 1 |
| 31 | 1 | 0 | 0 | 0 | 1 | 1 | 1 | 1 | 0 | 0 | 0 | 0 |
| 32 | 1 | 0 | 0 | 1 | 1 | 1 | 1 | 0 | 1 | 0 | 0 | 1 |
| 33 | 0 | 0 | 0 | 0 | 0 | 1 | 1 | 1 | 0 | 0 | 0 | 1 |
| 34 | 1 | 0 | 0 | 0 | 0 | 1 | 1 | 1 | 1 | 1 | 0 | 1 |
| 35 | 0 | 1 | 0 | 0 | 0 | 1 | 0 | 1 | 0 | 1 | 0 | 1 |
| 36 | 1 | 1 | 0 | 0 | 0 | 1 | 1 | 0 | 1 | 1 | 0 | 1 |
| 37 | 0 | 0 | 1 | 0 | 0 | 1 | 0 | 1 | 1 | 0 | 1 | 0 |
| 38 | 1 | 0 | 1 | 0 | 0 | 1 | 0 | 1 | 1 | 1 | 1 | 0 |
| 39 | 0 | 1 | 1 | 0 | 0 | 1 | 1 | 1 | 1 | 0 | 0 | 0 |
| 40 | 0 | 0 | 0 | 1 | 0 | 1 | 1 | 0 | 0 | 0 | 1 | 1 |
| 41 | 1 | 0 | 0 | 1 | 0 | 1 | 0 | 1 | 1 | 1 | 0 | 0 |
| 42 | 0 | 1 | 1 | 1 | 0 | 1 | 0 | 1 | 1 | 0 | 1 | 1 |
| 43 | 0 | 0 | 0 | 0 | 1 | 1 | 0 | 0 | 0 | 1 | 1 | 0 |
| 44 | 0 | 1 | 0 | 0 | 1 | 0 | 0 | 0 | 0 | 1 | 0 | 1 |
| 45 | 1 | 1 | 0 | 0 | 1 | 1 | 1 | 1 | 1 | 0 | 1 | 1 |
| 46 | 0 | 0 | 1 | 0 | 1 | 1 | 1 | 1 | 1 | 0 | 0 | 0 |
| 47 | 1 | 0 | 1 | 0 | 1 | 1 | 1 | 1 | 0 | 1 | 1 | 0 |
| 48 | 0 | 1 | 0 | 1 | 1 | 1 | 0 | 0 | 1 | 0 | 0 | 0 |
| 49 | 1 | 1 | 0 | 1 | 1 | 1 | 1 | 0 | 1 | 1 | 1 | 1 |
| 50 | 0 | 0 | 0 | 1 | 1 | 1 | 1 | 0 | 1 | 0 | 0 | 1 |
| 51 | 0 | 1 | 0 | 1 | 1 | 0 | 0 | 1 | 0 | 0 | 0 | 1 |
| 52 | 1 | 1 | 0 | 1 | 1 | 0 | 0 | 0 | 0 | 0 | 0 | 1 |
| 53 | 0 | 0 | 1 | 1 | 1 | 1 | 0 | 0 | 1 | 0 | 0 | 1 |
| 54 | 1 | 0 | 1 | 1 | 1 | 0 | 1 | 0 | 0 | 0 | 0 | 0 |
| 55 | 0 | 1 | 1 | 1 | 1 | 0 | 0 | 1 | 0 | 0 | 0 | 1 |
| 56 | 1 | 1 | 1 | 1 | 1 | 0 | 0 | 0 | 0 | 1 | 1 | 1 |
| 57 | 1 | 1 | 0 | 0 | 1 | 1 | 0 | 1 | 0 | 0 | 1 | 1 |
| 58 | 0 | 1 | 0 | 1 | 0 | 1 | 0 | 0 | 1 | 0 | 1 | 1 |
| 59 | 1 | 1 | 0 | 1 | 0 | 1 | 1 | 0 | 1 | 1 | 1 | 1 |
| 60 | 0 | 0 | 1 | 1 | 0 | 1 | 1 | 0 | 0 | 1 | 0 | 0 |

$v_1, v_2, \ldots, v_{12}$ are basis sequences (or vectors) included in the generator matrix G. The number ($v_k$) of the columns is indexes of input information bits, and the number (i) of the rows is bit indexes of codewords generated by the generator matrix G. The length of information bits is variable. When information bits with a length of 7 are input, the generator matrix G may have a size of 60×7. In this case, the generator matrix G includes only first to seventh columns, excluding the last five columns (i.e., the eighth to $12^{th}$ columns). In addition, if information bits with a length of 9 are input, the generator matrix G may have a size of 60×9. In this manner, the size of the generator matrix G may be expanded or reduced according to the length of the information bits.

The generator matrix is generated based on the (32, 6) RM code. First, a basic matrix is generated based on the (32, 6) RM code and then permutated to generate a 30×6 generator matrix A and a remaining portion 2×6 generator matrix B. In addition, 28 rows of the generator matrix A are selected to generate a generator matrix C. A 30×6 generator matrix D in which a minimum distance between codewords is maximized is generated in consideration of the generator matrix A, and a 30×6 generator matrix E in which a minimum distance between codewords is maximized is generated in consideration of the generator matrixes B and C.

The generator matrixes of Tables 25 and 26 may be used as generator matrixes of channel coding for a control channel.

The control channel includes at least one tile, and the tile includes at least one subcarrier of a frequency domain on at least one OFDM symbol of a time domain. The tile refers to a bundle of a plurality of subcarriers contagious in time domain and frequency domain. The tile includes a plurality of data subcarriers and/or pilot subcarriers. A sequence of a control signal may be mapped to the data subcarriers, and pilot for channel estimation may be mapped to the pilot subcarriers. The tile may include a plurality of mini-tiles, and each mini-tile may include at least one subcarrier of frequency domain on at least one OFDM symbol of time domain.

The plurality of tiles included in the control channel may be distributed in time domain or frequency domain to obtain a frequency diversity gain. For example, when a DRU is considered to include three tiles each including six contiguous subcarriers on six OFDM symbols, the control channel may include three tiles and each tile may be distributed to the frequency domain or the time domain. Or, the control channel may include at least one tile and the tile includes a plurality of mini-tiles which are distributed to the frequency domain or the time domain. For example, the mini-tiles may include (OFDM symbols subcarriers)=6×6, 3×6, 2×6, 1×6, 6×3, 6×2, 6×1, or the like.

A fast feedback channel (FBCH) may be used to transmit a CQI, MIMO feedback information, a bandwidth allocation signal, and the like. The FBCH includes a primary FBCH (PFBCH) and an secondary FBCH (SFBCH). A CQI with respect to wideband, MIMO feedback information, and the like, may be transmitted via the PFBCH. A CQI with respect to narrowband, MIMO feedback information, and the like, may be transmitted via the SFBCH. Namely, the CQI with respect to the overall frequency band, PMI, and the like, may be transmitted via the PFBCH, and the CQI with respect to the best band, PMI, and the like, may be transmitted via the SFBCH. The SFBCH may support more control information bits by using a higher code rate.

The FBCH may be allocated to a predetermined position defined in a broadcast message. The FBCH may be periodically allocated to terminals. Feedback information of a plurality of terminals may be multiplexed according to schemes of time division multiplexing (TDM), frequency division multiplexing (FDM), and code division multiplexing (CDM), and transmitted via the FBCH. An FBCH transmitting an acknowledgement (ACK)/non-acknowledgement (NACK) signal in response to data employing hybrid automatic retransmit request (HARM) scheme may start at a predefined offset from a data transmission.

The FBCH includes at least one mini-tile. Mini-tiles constituting the FBCH may include two contiguous subcarriers on six OFDM symbols. Or the mini-tiles constituting the FBCH may include six contiguous subcarriers on two OFDM symbols. The mini-tiles constituting the FBCH may be distributed to frequency domain or time domain. A single LRU may include a plurality of mini-tiles, and a multi-FBCH may be allocated to a single LRU.

FIG. 10 illustrates a process of mapping information in an SFBCH. First, in step S600, payload of the SFBCH is channel-coded through block coding. In this case, the coding process may differ according to the length of the payload. In step S610, QPSK modulation is performed on the channel-coded symbols. In step S620, the modulated symbols and a pilot sequence are combined into a single symbol sequence, and the symbol sequence is mapped to data subcarriers of SFBCH feedback mini-tiles (FMT) to finally form SFBCH symbols.

FIG. 11 shows one example of the SFBCH. An SFBCH 700 includes three mini-tiles 710, 720, and 730. A single mini-tile includes two pilot subcarriers, so the overall channel has six pilot subcarriers. The remaining 30 data subcarriers may carry information of 60 bits by performing QPSK. Accordingly, 60-bit codeword may be transmitted by using the 60×12 generator matrix of Table 26.

FIG. 12 shows another example of the SFBCH. An SFBCH 800 includes three mini-tiles 810, 820, and 830. A single mini-tile includes four pilot subcarriers, so the overall channel has twelve pilot subcarriers. The remaining 24 data subcarriers may carry information of 48 bits by performing QPSK. Accordingly, 48-bit codeword may be transmitted by using the 48×12 generator matrix of Table 25.

Table 27 below shows another example of the 60×12 generator matrix designed according to a proposed method.

TABLE 27

| | v1 | v2 | v3 | v4 | v5 | v6 | v7 | v8 | v9 | v10 | v11 | v12 |
|---|---|---|---|---|---|---|---|---|---|---|---|---|
| 1 | 0 | 0 | 0 | 0 | 0 | 1 | 0 | 0 | 0 | 0 | 1 | 0 |
| 2 | 1 | 0 | 0 | 0 | 0 | 1 | 0 | 0 | 0 | 0 | 1 | 1 |
| 3 | 0 | 1 | 0 | 0 | 0 | 1 | 1 | 0 | 0 | 0 | 0 | 0 |
| 4 | 1 | 1 | 0 | 0 | 0 | 1 | 0 | 0 | 0 | 1 | 1 | 1 |
| 5 | 0 | 0 | 1 | 0 | 0 | 1 | 1 | 0 | 1 | 1 | 0 | 0 |
| 6 | 1 | 0 | 1 | 0 | 0 | 1 | 0 | 0 | 0 | 1 | 1 | 0 |
| 7 | 0 | 1 | 1 | 0 | 0 | 1 | 0 | 0 | 1 | 0 | 1 | 1 |
| 8 | 0 | 0 | 0 | 1 | 0 | 1 | 0 | 1 | 1 | 0 | 0 | 1 |
| 9 | 1 | 0 | 0 | 1 | 0 | 1 | 1 | 1 | 0 | 0 | 0 | 1 |
| 10 | 0 | 1 | 1 | 1 | 0 | 1 | 1 | 0 | 0 | 0 | 1 | 0 |
| 11 | 0 | 0 | 0 | 0 | 1 | 1 | 1 | 0 | 0 | 0 | 0 | 1 |
| 12 | 0 | 1 | 0 | 0 | 1 | 1 | 1 | 1 | 0 | 1 | 1 | 1 |
| 13 | 1 | 1 | 0 | 0 | 1 | 1 | 1 | 0 | 1 | 0 | 1 | 0 |
| 14 | 0 | 0 | 1 | 0 | 1 | 1 | 0 | 1 | 1 | 1 | 0 | 0 |
| 15 | 1 | 0 | 1 | 0 | 1 | 1 | 0 | 1 | 0 | 1 | 0 | 1 |
| 16 | 0 | 1 | 1 | 0 | 1 | 1 | 0 | 0 | 1 | 0 | 1 | 0 |
| 17 | 1 | 1 | 1 | 0 | 1 | 1 | 0 | 1 | 1 | 1 | 0 | 0 |
| 18 | 0 | 0 | 0 | 1 | 1 | 1 | 0 | 1 | 0 | 0 | 0 | 1 |
| 19 | 0 | 1 | 0 | 1 | 1 | 1 | 1 | 0 | 1 | 0 | 1 | 1 |
| 20 | 1 | 1 | 0 | 1 | 1 | 1 | 1 | 0 | 0 | 1 | 1 | 0 |
| 21 | 0 | 0 | 1 | 1 | 1 | 1 | 0 | 0 | 1 | 0 | 1 | 0 |
| 22 | 1 | 0 | 1 | 1 | 1 | 1 | 1 | 1 | 0 | 0 | 0 | 1 |
| 23 | 0 | 0 | 1 | 1 | 1 | 1 | 1 | 1 | 0 | 0 | 1 | 1 |
| 24 | 1 | 1 | 1 | 1 | 1 | 1 | 1 | 1 | 1 | 1 | 1 | 0 |
| 25 | 1 | 1 | 1 | 0 | 0 | 1 | 0 | 1 | 0 | 0 | 1 | 1 |
| 26 | 0 | 1 | 0 | 1 | 0 | 1 | 1 | 0 | 1 | 1 | 1 | 0 |
| 27 | 1 | 1 | 0 | 1 | 0 | 1 | 0 | 0 | 1 | 1 | 1 | 1 |
| 28 | 0 | 0 | 1 | 1 | 0 | 1 | 0 | 1 | 1 | 0 | 1 | 1 |
| 29 | 1 | 0 | 1 | 1 | 0 | 1 | 0 | 1 | 0 | 1 | 0 | 1 |
| 30 | 1 | 1 | 1 | 1 | 0 | 1 | 1 | 1 | 1 | 1 | 1 | 1 |
| 31 | 1 | 0 | 0 | 0 | 1 | 1 | 1 | 1 | 0 | 0 | 0 | 0 |
| 32 | 1 | 0 | 0 | 1 | 1 | 1 | 1 | 0 | 1 | 0 | 1 | 1 |
| 33 | 0 | 0 | 0 | 0 | 1 | 1 | 0 | 1 | 0 | 0 | 1 | 1 |
| 34 | 1 | 0 | 0 | 0 | 0 | 1 | 0 | 1 | 1 | 1 | 0 | 1 |
| 35 | 0 | 1 | 0 | 0 | 1 | 0 | 0 | 0 | 0 | 0 | 0 | 1 |
| 36 | 1 | 1 | 0 | 0 | 0 | 1 | 0 | 1 | 1 | 1 | 1 | 1 |
| 37 | 0 | 0 | 1 | 0 | 0 | 1 | 0 | 0 | 1 | 0 | 1 | 1 |
| 38 | 1 | 0 | 1 | 0 | 0 | 1 | 1 | 1 | 1 | 1 | 1 | 1 |
| 39 | 0 | 1 | 1 | 0 | 0 | 1 | 1 | 1 | 1 | 0 | 0 | 0 |
| 40 | 0 | 0 | 0 | 1 | 0 | 1 | 0 | 0 | 0 | 1 | 0 | 0 |
| 41 | 1 | 0 | 0 | 1 | 0 | 1 | 0 | 1 | 1 | 1 | 0 | 0 |
| 42 | 0 | 1 | 1 | 1 | 0 | 0 | 1 | 0 | 1 | 0 | 0 | 1 |
| 43 | 0 | 0 | 0 | 0 | 1 | 1 | 0 | 1 | 0 | 1 | 0 | 1 |
| 44 | 0 | 1 | 0 | 0 | 1 | 1 | 0 | 1 | 0 | 0 | 0 | 1 |
| 45 | 1 | 0 | 1 | 0 | 1 | 1 | 0 | 0 | 1 | 0 | 0 | 1 |
| 46 | 0 | 0 | 1 | 0 | 1 | 1 | 0 | 0 | 1 | 1 | 1 | 0 |
| 47 | 1 | 0 | 1 | 0 | 1 | 0 | 1 | 0 | 1 | 0 | 1 | 1 |
| 48 | 0 | 1 | 1 | 0 | 1 | 1 | 0 | 1 | 0 | 1 | 0 | 0 |
| 49 | 1 | 1 | 1 | 0 | 1 | 1 | 0 | 0 | 0 | 1 | 1 | 1 |
| 50 | 0 | 0 | 0 | 1 | 1 | 1 | 1 | 1 | 0 | 0 | 0 | 0 |
| 51 | 0 | 1 | 0 | 1 | 1 | 1 | 0 | 0 | 0 | 1 | 1 | 1 |
| 52 | 1 | 0 | 1 | 1 | 1 | 1 | 1 | 1 | 0 | 1 | 0 | 0 |
| 53 | 0 | 0 | 1 | 1 | 1 | 0 | 1 | 0 | 1 | 1 | 0 | 0 |
| 54 | 0 | 1 | 0 | 1 | 1 | 0 | 0 | 1 | 0 | 0 | 1 | 1 |
| 55 | 0 | 1 | 1 | 1 | 1 | 0 | 1 | 1 | 1 | 0 | 0 | 0 |
| 56 | 1 | 1 | 1 | 1 | 1 | 1 | 1 | 0 | 0 | 0 | 1 | 1 |
| 57 | 1 | 1 | 1 | 0 | 0 | 1 | 1 | 0 | 0 | 1 | 1 | 0 |

TABLE 27-continued

| | v1 | v2 | v3 | v4 | v5 | v6 | v7 | v8 | v9 | v10 | v11 | v12 |
|---|---|---|---|---|---|---|---|---|---|---|---|---|
| 58 | 0 | 1 | 0 | 1 | 0 | 1 | 1 | 0 | 0 | 0 | 0 | 1 |
| 59 | 1 | 1 | 0 | 1 | 0 | 1 | 1 | 1 | 0 | 1 | 1 | 1 |
| 60 | 0 | 0 | 1 | 1 | 0 | 1 | 1 | 0 | 1 | 0 | 1 | 0 |

Table 28 below shows another example of the 36×12 generator matrix designed according to a proposed method.

TABLE 28

| | v1 | v2 | v3 | v4 | v5 | v6 | v7 | v8 | v9 | v10 | v11 | v12 |
|---|---|---|---|---|---|---|---|---|---|---|---|---|
| 1 | 0 | 0 | 0 | 0 | 0 | 1 | 0 | 0 | 0 | 0 | 1 | 0 |
| 2 | 1 | 0 | 0 | 0 | 0 | 1 | 0 | 0 | 0 | 0 | 1 | 1 |
| 3 | 0 | 1 | 0 | 0 | 0 | 1 | 1 | 0 | 0 | 0 | 0 | 0 |
| 4 | 1 | 1 | 0 | 0 | 0 | 1 | 0 | 0 | 0 | 1 | 1 | 1 |
| 5 | 0 | 0 | 1 | 0 | 0 | 1 | 1 | 0 | 1 | 1 | 0 | 0 |
| 6 | 1 | 0 | 1 | 0 | 0 | 1 | 0 | 0 | 0 | 1 | 1 | 0 |
| 7 | 0 | 1 | 1 | 0 | 0 | 1 | 0 | 0 | 1 | 0 | 1 | 1 |
| 8 | 0 | 0 | 0 | 1 | 0 | 1 | 0 | 1 | 1 | 0 | 0 | 0 |
| 9 | 1 | 0 | 0 | 1 | 0 | 1 | 1 | 1 | 1 | 0 | 0 | 1 |
| 10 | 0 | 1 | 1 | 1 | 0 | 1 | 1 | 0 | 0 | 1 | 1 | 0 |
| 11 | 0 | 0 | 0 | 0 | 1 | 1 | 1 | 0 | 0 | 0 | 0 | 1 |
| 12 | 0 | 1 | 0 | 0 | 1 | 1 | 1 | 1 | 0 | 1 | 1 | 1 |
| 13 | 1 | 1 | 0 | 0 | 1 | 1 | 1 | 0 | 1 | 0 | 1 | 0 |
| 14 | 0 | 0 | 1 | 0 | 1 | 1 | 0 | 1 | 1 | 1 | 0 | 0 |
| 15 | 1 | 0 | 1 | 0 | 1 | 1 | 0 | 1 | 0 | 1 | 0 | 1 |
| 16 | 0 | 1 | 1 | 0 | 1 | 1 | 0 | 0 | 1 | 1 | 0 | 1 |
| 17 | 1 | 1 | 1 | 0 | 1 | 1 | 0 | 1 | 1 | 1 | 0 | 0 |
| 18 | 0 | 0 | 0 | 1 | 1 | 1 | 0 | 1 | 0 | 0 | 0 | 1 |
| 19 | 0 | 1 | 0 | 1 | 1 | 1 | 1 | 0 | 1 | 0 | 1 | 1 |
| 20 | 1 | 1 | 0 | 1 | 1 | 1 | 1 | 0 | 0 | 1 | 1 | 0 |
| 21 | 0 | 0 | 1 | 1 | 1 | 1 | 0 | 0 | 1 | 0 | 1 | 0 |
| 22 | 1 | 0 | 1 | 1 | 1 | 1 | 1 | 1 | 0 | 0 | 0 | 1 |
| 23 | 0 | 1 | 1 | 1 | 1 | 1 | 1 | 1 | 0 | 0 | 1 | 1 |
| 24 | 1 | 1 | 1 | 1 | 1 | 1 | 1 | 1 | 1 | 1 | 1 | 0 |
| 25 | 1 | 1 | 1 | 0 | 0 | 1 | 0 | 1 | 0 | 0 | 1 | 1 |
| 26 | 0 | 1 | 0 | 1 | 0 | 1 | 1 | 0 | 1 | 1 | 1 | 0 |
| 27 | 1 | 1 | 0 | 1 | 0 | 1 | 0 | 0 | 1 | 1 | 1 | 1 |
| 28 | 0 | 0 | 1 | 1 | 0 | 1 | 0 | 1 | 1 | 0 | 1 | 1 |
| 29 | 1 | 0 | 1 | 1 | 0 | 1 | 0 | 1 | 0 | 1 | 0 | 1 |
| 30 | 1 | 1 | 1 | 1 | 0 | 1 | 1 | 1 | 1 | 1 | 1 | 1 |
| 31 | 1 | 0 | 0 | 0 | 1 | 1 | 1 | 1 | 0 | 0 | 0 | 0 |
| 32 | 1 | 0 | 0 | 1 | 1 | 1 | 1 | 0 | 1 | 0 | 0 | 1 |
| 33 | 0 | 0 | 0 | 0 | 1 | 0 | 1 | 0 | 0 | 0 | 0 | 0 |
| 34 | 1 | 0 | 0 | 0 | 0 | 1 | 0 | 0 | 0 | 0 | 0 | 1 |
| 35 | 0 | 1 | 0 | 0 | 0 | 1 | 0 | 0 | 0 | 0 | 0 | 1 |
| 36 | 1 | 1 | 0 | 0 | 0 | 1 | 1 | 0 | 0 | 0 | 0 | 1 |

$v_1, v_2, \ldots, v_{12}$ are basis sequences (or vectors) included in the generator matrix G. The number ($v_k$) of the columns is indexes of input information bits, and the number (i) of the rows is bit indexes of codewords generated by the generator matrix G. The length of information bits is variable. When information bits with a length of 7 are input, the generator matrix G may have a size of 36×7. In this case, the generator matrix G includes only first to seventh columns, excluding the last five columns (i.e., the eighth to 12$^{th}$ columns). In addition, if information bits with a length of 9 are input, the generator matrix G may have a size of 36×9. In this manner, the size of the generator matrix G may be expanded or reduced according to the length of the information bits.

The generator matrix is generated based on the (32, 6) RM code. First, a basic matrix is generated based on the (32, 6) RM code and then permutated to generate a 30×6 generator matrix A and a remaining portion 2×6 generator matrix B. In addition, four rows of the generator matrix A are selected to generate a generator matrix C. A 30×6 generator matrix D in which a minimum distance between codewords is maximized is generated in consideration of the generator matrix A, and a 6×6 generator matrix E in which a minimum distance between codewords is maximized is generated in consideration of the generator matrixes B and C.

Designing of the generator matrixes according to the proposed methods support more diverse lengths of information bits or codewords compared with the related art method. In particular, when variable information is desired to be transmitted by using limited communications resources, various methods can be employed depending on the amount (length) of the information to be transmitted. Namely, if the amount of information to be transmitted is large, several short codewords may be concatenated to be used, or if the amount of information to be transmitted is small, a codeword length may be increased by the amount of resource available for the length of the corresponding information bits to ensure a robust transmission. Also, designing of the generator matrixes according to the proposed methods shortens time for designing generator matrixes having similar error correction capability compared with the related art.

Table 29 below shows comparison between minimum distances of the related art in which generator matrixes are designed through simple repetition and the case of designing the generator matrixes according to the proposed method. In this case, the lengths of information bits to be transmitted were 7 bits to 12 bits, the available codeword length was 48 bits, and in the case of simple repetition, a codeword with a length of 24 bits was repeated twice.

TABLE 29

| | Info. length | | | | | |
|---|---|---|---|---|---|---|
| | 7 | 8 | 9 | 10 | 11 | 12 |
| Minimum Distance (repetition) | 18 | 14 | 14 | 12 | 12 | 10 |
| Minimum Distance (본 발명) | 19 | 18 | 18 | 17 | 16 | 15 |

With reference to Table 29, it is noted that the case where the generator matrixes are designed according to the proposed method have larger minimum distances, compared with the related art in which the generator matrix is designed through simple repetition. That is, it is noted that designing the generator matrixes according to the proposed method improves the characteristics of the minimum distance, a factor directly affecting the performance in block coding.

FIG. 13 shows a comparison between performances of the case where generator matrixes are designed through the simple repetition and the case that generator matrixes are designed according to a proposed method. As experimental environments, the speed of 120 km/h was assumed with a VehA channel mode, and the lengths of information bits were 7 bits to 12 bits. The available codeword length was 48 bits, and in the case of simple repetition, a codeword with a length of 24 bits was repeated twice.

With reference to FIG. 13, it is noted that when the length of the information bits is 12 bits, designing of the generator matrixes according to the proposed method shows an improvement of performance of about 0.7 dB compared with the related art in which generator matrixes are designed through simple repetition. Also, it is noted that as the amount of information increases, the effect of improving performance is large.

The present invention may be implemented by hardware, software, or their combination. Hardware may be implemented by ASIC (application specific integrated circuit), DSP (digital signal processing), PLD (programmable logic device), FPGA (field programmable gate array), processor, controller, microprocessor, other electronic units which have been designed to perform the above-described functions, or their combination. Software may be implemented by a module that performs the above-described functions. The software may be stored in the memory unit and executed by the processor. As the memory unit or the processor, various units well known to the person in the art can be employed.

The preferred embodiments of the present invention have been described with reference to the accompanying drawings, and it will be apparent to those skilled in the art that various modifications and variations can be made in the present invention without departing from the scope of the invention. Thus, it is intended that any future modifications of the embodiments of the present invention will come within the scope of the appended claims and their equivalents.

The invention claimed is:

1. A method for generating a codeword, comprising:
receiving information bits $m_k$ ($1 \leq k \leq r$) with a variable length;
selecting vectors by the length of $m_k$ from an i×r ($i \geq 1$ and i is integer) generator matrix $G=[v_1, v_2, \ldots, v_r]$ including r number of vectors;
performing operation of $$b = \sum_{n=1}^{k} (m_n \times v_n) \bmod 2$$

on the information bits to generate a codeword b with a length I, wherein mod is modulo operation.

2. The method of claim 1, wherein the generator matrix G is as shown in below table, wherein i is 24 and r is 10

| $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|
| 0 | 0 | 0 | 0 | 0 | 1 | 0 | 0 | 0 | 0 |
| 1 | 0 | 0 | 0 | 0 | 1 | 0 | 0 | 0 | 0 |
| 0 | 1 | 0 | 0 | 0 | 1 | 1 | 0 | 0 | 0 |
| 1 | 1 | 0 | 0 | 0 | 1 | 0 | 0 | 0 | 1 |
| 0 | 0 | 1 | 0 | 0 | 1 | 1 | 0 | 1 | 1 |
| 1 | 0 | 1 | 0 | 0 | 1 | 0 | 0 | 0 | 1 |
| 1 | 1 | 1 | 0 | 0 | 1 | 0 | 1 | 0 | 0 |
| 0 | 0 | 0 | 1 | 0 | 1 | 0 | 1 | 1 | 0 |
| 1 | 0 | 1 | 1 | 0 | 1 | 0 | 1 | 0 | 1 |
| 0 | 0 | 0 | 0 | 1 | 1 | 1 | 0 | 0 | 0 |
| 1 | 0 | 0 | 0 | 1 | 1 | 1 | 1 | 0 | 0 |
| 0 | 1 | 0 | 0 | 1 | 1 | 1 | 1 | 0 | 1 |
| 1 | 1 | 0 | 0 | 1 | 1 | 1 | 0 | 1 | 0 |
| 0 | 0 | 1 | 0 | 1 | 1 | 0 | 1 | 1 | 1 |
| 1 | 0 | 1 | 0 | 1 | 1 | 0 | 1 | 0 | 1 |
| 0 | 1 | 1 | 0 | 1 | 1 | 0 | 0 | 1 | 1 |
| 0 | 0 | 0 | 1 | 1 | 1 | 0 | 1 | 0 | 0 |
| 1 | 0 | 0 | 1 | 1 | 1 | 1 | 0 | 0 | 1 |
| 0 | 1 | 0 | 1 | 1 | 1 | 0 | 1 | 1 | 0 |
| 1 | 1 | 0 | 1 | 1 | 1 | 1 | 0 | 0 | 1 |
| 0 | 0 | 1 | 1 | 1 | 1 | 0 | 0 | 1 | 0 |
| 1 | 0 | 1 | 1 | 1 | 1 | 1 | 1 | 0 | 0 |
| 0 | 1 | 1 | 1 | 1 | 1 | 1 | 1 | 1 | 0 |
| 1 | 1 | 1 | 1 | 1 | 1 | 1 | 1 | 1 | 1 |

3. The method of claim 1, wherein the generator matrix G is as shown in below table, wherein i is 24 and r is 10

| $v_1$ | $v_2$ | $v_3$ | $v_4$ | $v_5$ | $v_6$ | $v_7$ | $v_8$ | $v_9$ | $v_{10}$ |
|---|---|---|---|---|---|---|---|---|---|
| 0 | 0 | 0 | 0 | 0 | 1 | 0 | 0 | 0 | 0 |
| 1 | 0 | 0 | 0 | 0 | 1 | 0 | 0 | 0 | 0 |
| 0 | 0 | 1 | 0 | 0 | 1 | 1 | 0 | 1 | 1 |
| 1 | 0 | 1 | 0 | 0 | 1 | 0 | 0 | 0 | 1 |

-continued

| v₁ | v₂ | v₃ | v₄ | v₅ | v₆ | v₇ | v₈ | v₉ | v₁₀ |
|---|---|---|---|---|---|---|---|---|---|
| 1 | 1 | 1 | 0 | 0 | 1 | 0 | 1 | 0 | 0 |
| 0 | 0 | 0 | 1 | 0 | 1 | 0 | 1 | 1 | 0 |
| 0 | 1 | 0 | 1 | 0 | 1 | 1 | 0 | 1 | 1 |
| 1 | 1 | 0 | 1 | 0 | 1 | 0 | 0 | 1 | 1 |
| 0 | 0 | 1 | 1 | 0 | 1 | 0 | 1 | 1 | 0 |
| 1 | 0 | 1 | 1 | 0 | 1 | 0 | 1 | 0 | 1 |
| 0 | 1 | 1 | 1 | 0 | 1 | 1 | 0 | 0 | 1 |
| 1 | 1 | 1 | 1 | 0 | 1 | 1 | 1 | 1 | 1 |
| 1 | 0 | 0 | 0 | 1 | 1 | 1 | 1 | 0 | 0 |
| 0 | 1 | 0 | 0 | 1 | 1 | 1 | 1 | 0 | 1 |
| 1 | 1 | 0 | 0 | 1 | 1 | 1 | 0 | 1 | 0 |
| 0 | 0 | 1 | 0 | 1 | 1 | 0 | 1 | 1 | 1 |
| 1 | 0 | 1 | 0 | 1 | 1 | 0 | 1 | 0 | 1 |
| 0 | 1 | 1 | 0 | 1 | 1 | 0 | 0 | 1 | 1 |
| 1 | 1 | 1 | 0 | 1 | 1 | 0 | 1 | 1 | 1 |
| 1 | 0 | 0 | 1 | 1 | 1 | 1 | 1 | 0 | 1 |
| 0 | 1 | 0 | 1 | 1 | 1 | 1 | 0 | 1 | 0 |
| 0 | 0 | 1 | 1 | 1 | 1 | 0 | 0 | 1 | 0 |
| 0 | 1 | 1 | 1 | 1 | 1 | 1 | 1 | 1 | 0 |
| 1 | 1 | 1 | 1 | 1 | 1 | 1 | 1 | 1 | 1. |

4. The method of claim 1, wherein the generator matrix G is as shown in below table, wherein i is 24 and r is 10

| v₁ | v₂ | v₃ | v₄ | v₅ | v₆ | v₇ | v₈ | v₉ | v₁₀ |
|---|---|---|---|---|---|---|---|---|---|
| 0 | 0 | 0 | 0 | 0 | 1 | 0 | 0 | 0 | 0 |
| 1 | 0 | 0 | 0 | 0 | 1 | 0 | 0 | 0 | 0 |
| 0 | 1 | 0 | 0 | 0 | 1 | 1 | 0 | 0 | 0 |
| 1 | 1 | 0 | 0 | 0 | 1 | 0 | 0 | 0 | 1 |
| 0 | 0 | 1 | 0 | 0 | 1 | 1 | 0 | 1 | 1 |
| 1 | 0 | 1 | 0 | 0 | 1 | 0 | 0 | 0 | 1 |
| 0 | 1 | 1 | 0 | 0 | 1 | 0 | 0 | 1 | 0 |
| 0 | 0 | 0 | 1 | 0 | 1 | 0 | 1 | 1 | 0 |
| 1 | 0 | 0 | 1 | 0 | 1 | 1 | 1 | 1 | 0 |
| 0 | 1 | 1 | 1 | 0 | 1 | 1 | 0 | 0 | 1 |
| 0 | 0 | 0 | 0 | 1 | 1 | 1 | 0 | 0 | 0 |
| 0 | 1 | 0 | 0 | 1 | 1 | 1 | 1 | 0 | 1 |
| 1 | 1 | 0 | 0 | 1 | 1 | 1 | 0 | 1 | 0 |
| 0 | 0 | 1 | 0 | 1 | 1 | 0 | 1 | 1 | 1 |
| 1 | 0 | 1 | 0 | 1 | 1 | 0 | 1 | 0 | 1 |
| 0 | 1 | 1 | 0 | 1 | 1 | 0 | 0 | 1 | 1 |
| 1 | 1 | 1 | 0 | 1 | 1 | 0 | 1 | 1 | 1 |
| 0 | 0 | 0 | 1 | 1 | 1 | 0 | 1 | 0 | 0 |
| 0 | 1 | 0 | 1 | 1 | 1 | 1 | 0 | 1 | 0 |
| 1 | 1 | 0 | 1 | 1 | 1 | 1 | 0 | 0 | 1 |
| 0 | 0 | 1 | 1 | 1 | 1 | 0 | 0 | 1 | 0 |
| 1 | 0 | 1 | 1 | 1 | 1 | 1 | 1 | 0 | 0 |
| 0 | 1 | 1 | 1 | 1 | 1 | 1 | 1 | 1 | 0 |
| 1 | 1 | 1 | 1 | 1 | 1 | 1 | 1 | 1 | 1 |

5. The method of claim 1, wherein the generator matrix G is as shown in below table, wherein i is 24 and r is 10

| v₁ | v₂ | v₃ | v₄ | v₅ | v₆ | v₇ | v₈ | v₉ | v₁₀ |
|---|---|---|---|---|---|---|---|---|---|
| 0 | 0 | 0 | 0 | 0 | 1 | 0 | 0 | 0 | 0 |
| 1 | 0 | 0 | 0 | 0 | 1 | 0 | 0 | 0 | 0 |
| 0 | 1 | 0 | 0 | 0 | 1 | 1 | 0 | 0 | 0 |
| 1 | 0 | 1 | 0 | 0 | 1 | 0 | 0 | 0 | 1 |
| 0 | 1 | 1 | 0 | 0 | 1 | 0 | 0 | 1 | 0 |
| 0 | 0 | 0 | 1 | 0 | 1 | 0 | 1 | 1 | 0 |
| 1 | 0 | 0 | 1 | 0 | 1 | 1 | 1 | 1 | 0 |
| 1 | 1 | 0 | 1 | 0 | 1 | 0 | 0 | 1 | 1 |
| 0 | 0 | 1 | 1 | 0 | 1 | 0 | 1 | 1 | 0 |
| 1 | 0 | 1 | 1 | 0 | 1 | 0 | 1 | 0 | 1 |
| 1 | 1 | 1 | 1 | 0 | 1 | 1 | 1 | 1 | 1 |
| 0 | 0 | 0 | 0 | 1 | 1 | 0 | 0 | 0 | 0 |
| 1 | 0 | 0 | 0 | 1 | 1 | 1 | 0 | 0 | 0 |

-continued

| v₁ | v₂ | v₃ | v₄ | v₅ | v₆ | v₇ | v₈ | v₉ | v₁₀ |
|---|---|---|---|---|---|---|---|---|---|
| 1 | 1 | 0 | 0 | 1 | 1 | 1 | 0 | 1 | 0 |
| 0 | 0 | 1 | 0 | 1 | 1 | 0 | 1 | 1 | 1 |
| 1 | 0 | 1 | 0 | 1 | 1 | 0 | 1 | 0 | 1 |
| 0 | 1 | 1 | 0 | 1 | 1 | 0 | 0 | 1 | 1 |
| 1 | 1 | 1 | 0 | 1 | 1 | 0 | 1 | 1 | 1 |
| 0 | 0 | 0 | 1 | 1 | 1 | 0 | 1 | 0 | 0 |
| 1 | 0 | 0 | 1 | 1 | 1 | 1 | 1 | 0 | 1 |
| 1 | 1 | 0 | 1 | 1 | 1 | 1 | 0 | 0 | 1 |
| 0 | 0 | 1 | 1 | 1 | 1 | 0 | 0 | 1 | 0 |
| 0 | 1 | 1 | 1 | 1 | 1 | 1 | 1 | 1 | 0 |

6. The method of claim 1, wherein the generator matrix G includes 24 row sets selected from a below table

| v₁ | v₂ | v₃ | v₄ | v₅ | v₆ | v₇ | v₈ | v₉ | v₁₀ |
|---|---|---|---|---|---|---|---|---|---|
| 0 | 0 | 0 | 0 | 0 | 1 | 0 | 0 | 0 | 0 |
| 1 | 0 | 0 | 0 | 0 | 1 | 0 | 0 | 0 | 0 |
| 0 | 1 | 0 | 0 | 0 | 1 | 1 | 0 | 0 | 0 |
| 1 | 1 | 0 | 0 | 0 | 1 | 0 | 0 | 0 | 1 |
| 0 | 0 | 1 | 0 | 0 | 1 | 1 | 0 | 1 | 1 |
| 1 | 0 | 1 | 0 | 0 | 1 | 0 | 0 | 0 | 1 |
| 0 | 1 | 1 | 0 | 0 | 1 | 0 | 0 | 1 | 0 |
| 1 | 1 | 1 | 0 | 0 | 1 | 0 | 1 | 0 | 0 |
| 0 | 0 | 0 | 1 | 0 | 1 | 0 | 1 | 1 | 0 |
| 1 | 0 | 0 | 1 | 0 | 1 | 1 | 1 | 1 | 0 |
| 0 | 1 | 0 | 1 | 0 | 1 | 1 | 0 | 1 | 1 |
| 1 | 1 | 0 | 1 | 0 | 1 | 0 | 0 | 1 | 1 |
| 0 | 0 | 1 | 1 | 0 | 1 | 0 | 1 | 1 | 0 |
| 1 | 0 | 1 | 1 | 0 | 1 | 0 | 1 | 0 | 1 |
| 0 | 1 | 1 | 1 | 0 | 1 | 1 | 0 | 0 | 1 |
| 1 | 1 | 1 | 1 | 0 | 1 | 1 | 1 | 1 | 1 |
| 0 | 0 | 0 | 0 | 1 | 1 | 0 | 0 | 0 | 0 |
| 1 | 0 | 0 | 0 | 1 | 1 | 1 | 1 | 0 | 0 |
| 0 | 1 | 0 | 0 | 1 | 1 | 1 | 1 | 0 | 1 |
| 1 | 1 | 0 | 0 | 1 | 1 | 1 | 0 | 1 | 0 |
| 0 | 0 | 1 | 0 | 1 | 1 | 0 | 1 | 1 | 1 |
| 1 | 0 | 1 | 0 | 1 | 1 | 0 | 1 | 0 | 1 |
| 0 | 1 | 1 | 0 | 1 | 1 | 0 | 0 | 1 | 1 |
| 1 | 1 | 1 | 0 | 1 | 1 | 1 | 1 | 1 | 1 |
| 0 | 0 | 0 | 1 | 1 | 1 | 0 | 1 | 0 | 0 |
| 1 | 0 | 0 | 1 | 1 | 1 | 1 | 1 | 0 | 0 |
| 0 | 1 | 0 | 1 | 1 | 1 | 1 | 0 | 1 | 0 |
| 1 | 1 | 0 | 1 | 1 | 1 | 1 | 0 | 0 | 1 |
| 0 | 0 | 1 | 1 | 1 | 1 | 0 | 0 | 1 | 0 |
| 1 | 0 | 1 | 1 | 1 | 1 | 1 | 1 | 0 | 0 |
| 0 | 1 | 1 | 1 | 1 | 1 | 1 | 1 | 1 | 0 |
| 1 | 1 | 1 | 1 | 1 | 1 | 1 | 1 | 1 | 1 |

7. The method of claim 6, wherein the row sets are determined based on the size of a minimum distance between codewords.

8. The method of claim 6, wherein the row sets are determined based on the size of the sum of probabilities of undetected error of each bit of a codeword calculated according to the length of the information bits.

9. The method of claim 6, wherein the row sets are determined based on the size of a minimum distance between codewords and the size of the sum of probabilities of undetected error of each bit of a codeword calculated according to the length of the information bits.

10. A method for generating a codeword, comprising:
  receiving information bits with a length of k;
  generating a kr (r is a natural number) generator matrix G=[v₁, v₂, v₃, . . . , v_r]^T including k number of row vectors; and
  generating a codeword with a length of r by using the information bits and the generator matrix, wherein
one row vector $v_n$ ($1 \leq n \leq r$, n is a natural number) of the k number of row vectors comprises elements which are all 1,
the other remaining row vectors, excluding the one row vector $v_n$, among the k number of row vectors have the same weight, and the weight is the number of 1 among the elements constituting the row vectors, and
each of the other remaining row vectors has patterns of 0 and 1 which are repeated in the cycle of a divisor of r.

11. The method of claim 10, wherein r number of column vectors constituting the generator matrix G each are not repeated.

12. The method of claim 10, wherein the generator matrix G is $$G = \begin{bmatrix} 010101010101010101010101 \\ 001100110011001100110011 \\ 000111000111000111000111 \\ 000000111111000000111111 \\ 111111111111111111111111 \\ 000000000000111111111111 \end{bmatrix}$$

wherein k is 6 and r is 24.

13. A method for generating a codeword, comprising:
receiving information bits with a length of k (k is a natural number);
generating a gk generator matrix $G=[v_1, v_2, v_3, \ldots, v_r]$ including k number of vectors; and
generating a codeword with a length of g by using the information bits an the generator matrix,
wherein the generator matrix G comprises:
an n×i generator matrix A generated by permutating a basic matrix generated based on a (m+n)×i block code by rows and selecting n number of rows from the basic matrix;
an m×i generator matrix B generated by selecting the other remaining m number of rows excluding the n number of rows; and
a 1×i generator matrix C generated by selecting 1 number of rows from the generator matrix A,
wherein g is n+m+1.

14. The method of claim 13, wherein if k>i, the generator matrix G further comprises an n×j generator matrix D; and an h×j generator matrix E, wherein j is k−i and h is m+1.

15. The method of claim 14, wherein the generator matrixes D and E are determined such that a minimum distance is maximized.

* * * * *